US012648467B2

(12) United States Patent (10) Patent No.: US 12,648,467 B2

Cho (45) Date of Patent: Jun. 2, 2026

(54) SEMICONDUCTOR PACKAGE

(71) Applicant: SAMSUNG ELECTRONICS CO., LTD., Suwon-si (KR)

(72) Inventor: Eun Ho Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 427 days.

(21) Appl. No.: 18/379,034

(22) Filed: Oct. 11, 2023

(65) Prior Publication Data

US 2024/0266271 A1 Aug. 8, 2024

(30) Foreign Application Priority Data

Feb. 6, 2023 (KR) ......................... 10-2023-0015522

(51) Int. Cl.
| | |
|---|---|
| H10W 70/65 | (2026.01) |
| H05K 1/11 | (2006.01) |
| H10W 90/00 | (2026.01) |
| H10W 74/15 | (2026.01) |

(52) U.S. Cl.
CPC ............. H10W 70/65 (2026.01); H05K 1/111 (2013.01); H10W 90/00 (2026.01); H10W 90/701 (2026.01); H05K 2201/10734 (2013.01); H10W 74/15 (2026.01); H10W 90/724 (2026.01); H10W 90/734 (2026.01); H10W 90/794 (2026.01)

(58) Field of Classification Search
CPC ... H10W 70/65; H10W 90/00; H10W 90/701; H10W 74/15; H10W 90/724; H10W 90/734; H10W 90/794; H05K 1/111; H05K 2201/10734
See application file for complete search history.

(56) References Cited

U.S. PATENT DOCUMENTS

| | | | |
|---|---|---|---|
| 9,269,647 B2 | 2/2016 | Du | |
| 10,163,750 B2 | 12/2018 | Yu et al. | |
| 11,139,223 B2 | 10/2021 | Yu et al. | |
| 11,177,192 B2 | 11/2021 | Teng et al. | |
| 11,387,164 B2 | 7/2022 | Wu et al. | |
| 2020/0296862 A1 | 9/2020 | Iyengar et al. | |
| 2021/0257275 A1* | 8/2021 | Park | H01L 23/3737 |
| 2022/0216128 A1 | 7/2022 | Zhang et al. | |

* cited by examiner

*Primary Examiner* — Fernando L Toledo
*Assistant Examiner* — Adam S Bowen
(74) *Attorney, Agent, or Firm* — Sughrue Mion, PLLC

(57) ABSTRACT

A semiconductor package includes a package substrate, an interposer on the package substrate and including first upper pads, the first upper pads including a first set of upper pads and a second set of upper pads, a first semiconductor chip on the interposer and comprising first lower pads respectively connected to the first set of upper pads, a plurality of first pins on a first top surface of the first semiconductor chip and substantially uniformly spaced apart by a first distance, and a plurality of second pins on the first top surface of the first semiconductor chip and substantially uniformly spaced apart by a second distance that is different from the first distance, where the first top surface of the first semiconductor chip includes a first region and a second region that does not overlap the first region.

20 Claims, 48 Drawing Sheets

SEMICONDUCTOR PACKAGE

CROSS-REFERENCE TO RELATED APPLICATION

This application is based on and claims priority to Korean Patent Application No. 10-2023-0015522, filed on Feb. 6, 2023, in the Korean Intellectual Property Office, the disclosure of which is incorporated by reference herein in its entirety.

BACKGROUND

1. Field

Example embodiments of the present disclosure relate to a semiconductor package.

2. Description of the Related Art

Storage devices are widely used not only in traditional electronic devices such as desktop personal computers (PCs), tablet PCs, and laptop PCs, but also in mobility-related electronic devices such as automobiles, drones, and aircraft. Also, the storage devices may be used in large-scale datacenters or the like.

Immersion cooling may be used to facilitate the dissipation of heat from storage devices. As storage devices used in, for example, a large-scale datacenter generate a considerable amount of heat, consuming a considerable amount of power, they may be used by being immersed in a dielectric immersion cooling liquid.

SUMMARY

One or more example embodiments provide a semiconductor package with an improved product reliability.

Additional aspects will be set forth in part in the description which follows and, in part, will be apparent from the description, or may be learned by practice of the presented embodiments.

According to an aspect of an example embodiment, a semiconductor package includes a package substrate, an interposer on the package substrate and including first upper pads, the first upper pads including a first set of upper pads and a second set of upper pads, a first semiconductor chip on the interposer and including first lower pads respectively connected to the first set of upper pads, a plurality of first pins on a first top surface of the first semiconductor chip and substantially uniformly spaced apart by a first distance, and a plurality of second pins on the first top surface of the first semiconductor chip and substantially uniformly spaced apart by a second distance that is different from the first distance, where the first top surface of the first semiconductor chip includes a first region and a second region that does not overlap the first region, the plurality of first pins are in the first region and the plurality of second pins are in the second region.

According to an aspect of an example embodiment, a semiconductor package includes a package substrate, an interposer on the package substrate and including first upper pads, the first upper pads including a first set of upper pads and a second set of upper pads, a first semiconductor chip on the interposer and including first lower pads respectively connected to the first set of upper pads, a second semiconductor chip on the interposer and spaced apart from the first semiconductor chip, the second semiconductor chip including second lower pads respectively connected to the second set of upper pads, a plurality of first protruding structures in a first region of a first top surface of the first semiconductor chip, the plurality of first protruding structures being spaced apart by a first distance, and a plurality of second protruding structures spaced apart by a second distance that is less than the first distance, the plurality of second protruding structures being spaced apart from the plurality of first protruding structures, where the first top surface of the first semiconductor chip includes a second region that does not overlap the first region, a second top surface of the second semiconductor chip includes a third region, and the plurality of second protruding structures are in at least one of the second region and the third region.

According to an aspect of an example embodiment, a semiconductor package includes a package substrate including upper substrate pads exposed at a top surface of the package substrate, an interposer on the package substrate and including first upper pads, the first upper pads including a first set of upper pads and a second set of upper pads, a first semiconductor chip on the interposer, the first semiconductor chip including first lower bumps and first lower pads respectively connected to the first set of upper pads, a second semiconductor chip on the interposer and spaced apart from the first semiconductor chip, the second semiconductor chip including second lower bumps and second lower pads respectively connected to the second set of upper pads, a plurality of first pins in a first region of a first top surface of the first semiconductor chip, the plurality of first pins being spaced apart by a first distance, and a plurality of second pins spaced apart by a second distance that is less than the first distance, where the interposer further includes third lower bumps and third lower pads respectively connected to the upper substrate pads, the first lower bumps are between the first set of upper pads and the first lower pads, the second lower bumps are between the second set of upper pads and the second lower pads, the plurality of first pins and the plurality of second pins include a metal material, the first top surface of the first semiconductor chip includes a second region that does not overlap the first region, a second top surface of the second semiconductor chip includes a third region, the plurality of second pins are in at least one of the second region and the third region, the first semiconductor chip includes a logic semiconductor chip and the second semiconductor chip includes at least one memory semiconductor chip.

According to an aspect of an example embodiment, a semiconductor package may include a package substrate, an interposer on the package substrate and including first upper pads, the first upper pads including a first set of upper pads and a second set of upper pads, a first semiconductor chip on the interposer and including first lower pads respectively connected to the first set of upper pads, a plurality of first spheres on a first top surface of the first semiconductor chip and spaced apart by a first distance, and a plurality of second spheres on the first top surface of the first semiconductor chip and spaced apart by a second distance that is different from the first distance, where the first top surface of the first semiconductor chip includes a first region and a second region that does not overlap the first region, the plurality of first spheres are in the first region, the plurality of second spheres are in the second region, the plurality of first spheres and the plurality of second spheres include a metal material, and the first top surface of the first semiconductor chip includes silicon.

According to an aspect of an example embodiment, a semiconductor package includes a package substrate, an interposer on the package substrate and including first upper pads, the first upper pads including a first set of upper pads and a second set of upper pads, a first semiconductor chip on the interposer and including first lower pads respectively connected to the first set of upper pads, a second semiconductor chip on the interposer and spaced apart from the first semiconductor chip, the second semiconductor chip including second lower pads respectively connected to the second set of upper pads, a first mold film on a first top surface of the first semiconductor chip, a plurality of first holes in the first mold film and in a first region of the first top surface, the plurality of first holes having a first diameter, and a plurality of second holes in the first mold film and in a second region of the first top surface that does not overlap the first region, the plurality of second holes including a second diameter that is different from the first diameter, where the first semiconductor chip includes a logic semiconductor chip and the second semiconductor chip includes a memory semiconductor chip.

BRIEF DESCRIPTION OF DRAWINGS

The above and other aspects, features, and advantages of certain example embodiments of the present disclosure will be more apparent from the following description taken in conjunction with the accompanying drawings, in which:

FIG. 6 is a layout view of a semiconductor package according to one or more embodiments of the present disclosure;

FIG. 8 is a layout view of a semiconductor package according to one or more embodiments of the present disclosure;

FIG. 24 is an enlarged cross-sectional view of an area P of FIG. 23 according to one or more embodiments of the present disclosure;

FIG. 27 is an enlarged cross-sectional view of an area Q of FIG. 26 according to one or more embodiments of the present disclosure;

DETAILED DESCRIPTION

Figure 1:
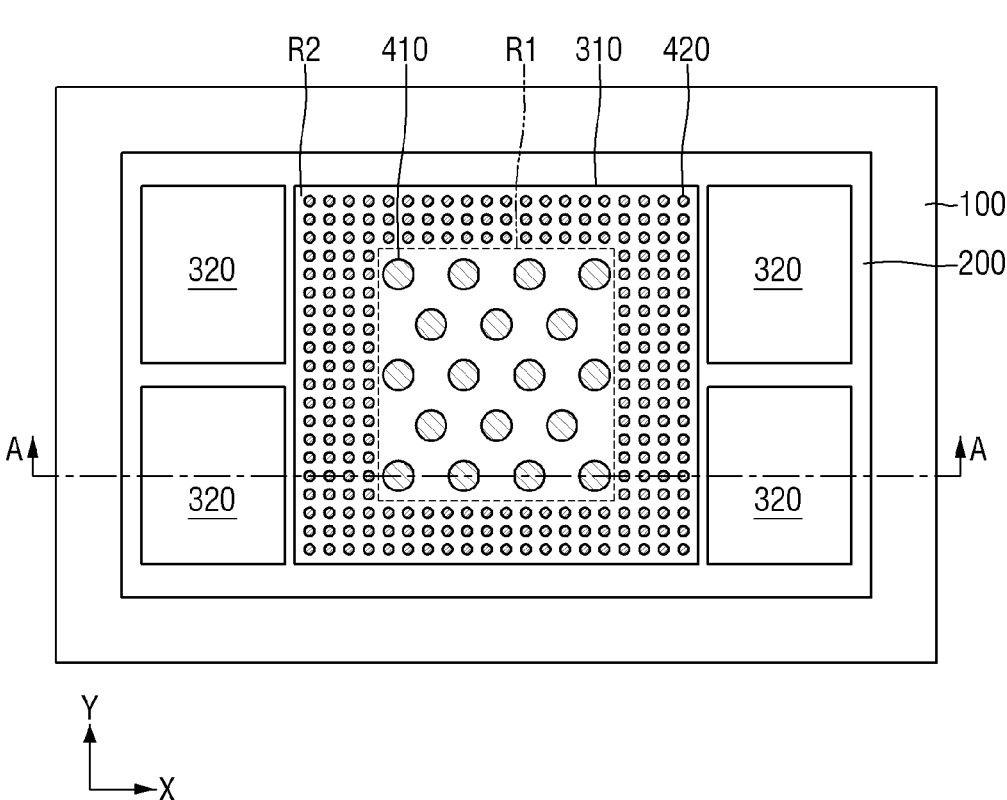
FIG. 1 is a layout view of a semiconductor package according to one or more embodiments of the present disclosure.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

Figure 2:
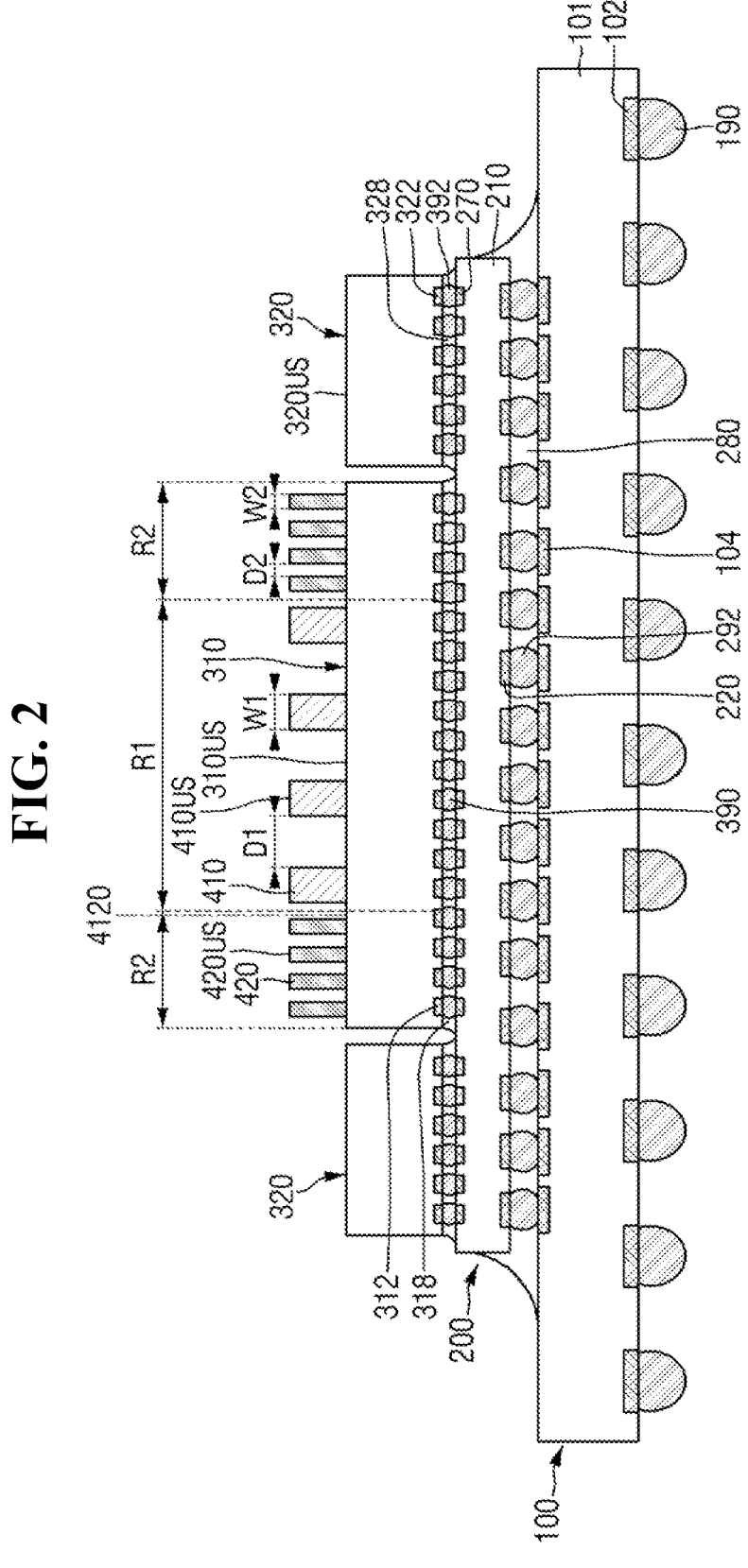
FIG. 2 is a cross-sectional view taken along line A-A of FIG. 1 according to one or more embodiments of the present disclosure.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c FIG. 1 is a layout view of a semiconductor package according to one or more embodiments of the present disclosure. FIG. 2 is a cross-sectional view taken along line A-A of FIG. 1.

Referring to FIGS. 1 and 2, the semiconductor package according to one or more embodiments of the present disclosure may include a package substrate 100, an interposer 200, a first semiconductor chip 310, second semiconductor chips 320, first pins 410, and second pins 420.

The package substrate 100 may be a substrate for a semiconductor package. For example, the package substrate 100 may be a printed circuit board (PCB). The package substrate 100 may have bottom and top surfaces that are opposite to each other.

The package substrate 100 may include an insulating core 101, first substrate pads 102, and second substrate pads 104. The first substrate pads 102 and the second substrate pads 104 may be used to electrically connect the package substrate 100 to other elements of the semiconductor package according to one or more embodiments of the present disclosure. For example, the first substrate pads 102 may be exposed at the bottom surface of the insulating core 101, and the second substrate pads 104 may be exposed at the top surface of the insulating core 101. The first substrate pads 102 and the second substrate pads 104 may include a metal material such as, for example, copper (Cu) or aluminum (Al), but the present disclosure is not limited thereto.

Wiring patterns for electrically connecting the first substrate pads 102 and the second substrate pads 104, may be formed in the insulating core 101. The insulating core 101 is illustrated as being a single layer, but the present disclosure is not limited thereto. Alternatively, the insulating core 101 may be formed as a multilayer, and multilayer wiring patterns may be formed in the insulating core 101.

The package substrate 100 may be mounted on a main board of an electronic device. For example, substrate bumps 190, which are connected to the first substrate pads 102, may be formed. The package substrate 100 may be mounted on a main board of an electronic device via the substrate bumps 190. The package substrate 100 may be a ball grid array (BGA) substrate, but the present disclosure is not limited thereto.

The substrate bumps 190 may be, for example, solder bumps, but the present disclosure is not limited thereto. The substrate bumps 190 may have various shapes such as land, ball, pin, pillar shapes. The number of substrate bumps 190, the distance between the substrate bumps 190, and the layout of the substrate bumps 190 are not particularly limited, and may vary.

The interposer 200 may be disposed on the top surface of the package substrate 100. The interposer 200 may be a silicon (Si) interposer or an organic interposer, but the present disclosure is not limited thereto. The interposer 200 may have bottom and top surfaces that are opposite to each other. The bottom surface of the interposer 200 may face the top surface of the package substrate 100. The interposer 200 may facilitate the connection of the package substrate 100, the first semiconductor chip 310, the second semiconductor chips 320 and may reduce the warpage of the semiconductor package according to one or more embodiments of the present disclosure.

The interposer 200 may include an interposer substrate 210, lower pads 220, and upper pads 270. The lower pads 220 and the upper pads 270 may be used to electrically connect the interposer 200 and other elements of the semiconductor package according to one or more embodiments of the present disclosure. For example, as illustrated in FIG. 2, the lower pads 220 may be exposed at the bottom surface of the interposer substrate 210, and the upper pads 270 may be exposed at the top surface of the interposer substrate 210. The lower pads 220 and the upper pads 270 may include a metal material such as, for example, Cu or Al, but the present disclosure is not limited thereto.

The interposer 200 may be mounted on the top surface of the package substrate 100. For example, interposer bumps 292 may be formed between the package substrate 100 and the interposer 200. The interposer bumps 292 may connect the second substrate pads 104 and the lower pads 220. In this manner, the package substrate 100 and the interposer 200 may be electrically connected.

The interposer bumps 292 may be solder bumps including a metal with a low melting point such as, for example, tin (Sn) and a Sn alloy, but the present disclosure is not limited thereto. The interposer bumps 292 may have various shapes such as land, ball, pin, and pillar shapes. The interposer bumps 292 may be formed as single layers or multilayers. For example, in a case where the interposer bumps 292 are formed as single layers, the interposer bumps 292 may include tin (Sn)-silver (Ag) solder or Cu. In another example, in a case where the interposer bumps 292 are formed as multilayers, the interposer bumps 292 may include Cu pillars and solder. The number of interposer bumps 292 the distance between the interposer bumps 292, and the layout of the interposer bumps 292 are not particularly limited, and may vary.

In one or more embodiments, a first underfill 280 may be formed between the package substrate 100 and the interposer 200. The first underfill 280 may fill or substantially fill the space between the package substrate 100 and the interposer 200. The first underfill 280 may cover or at least partially cover the interposer bumps 292. The first underfill 280 may prevent breakage of the interposer 200 by fixing the interposer 200 on the package substrate 100. The first underfill 280 may include an insulating polymer material such as, for example, an epoxy molding compound (EMC), but the present disclosure is not limited thereto.

The first semiconductor chip 310 and the second semiconductor chips 320 may be disposed on the top surface of the interposer 200 to be spaced apart from each other. The first semiconductor chip 310 and the second semiconductor chips 320 may be integrated circuits (ICs).

In one or more embodiments, the first semiconductor chip 310 may be a logic semiconductor chip. For example, the first semiconductor chip 310 may be a central processing unit (CPU), a graphics processing unit (GPU), a field-programmable gate array (FPGA), a digital signal processor, a cryptographic processor, a microprocessor, a microcontroller, or an application processor (AP) such as an application-specific IC (ASIC), but the present disclosure is not limited thereto.

In one or more embodiments, the second semiconductor chips 320 may be memory semiconductor chips. For example, the second semiconductor chips 320 may be volatile memories such as dynamic random access memories (DRAMs) or static random access memories (SRAMs) or nonvolatile memories such as flash memories, phase-change random access memories (PRAMs), magnetoresistive random access memories (MRAMs), ferroelectric random access memories (FeRAMs), or resistive random access memories (RRAMs).

For example, the first semiconductor chip 310 may be an ASIC such as a GPU, and the second semiconductor chips 320 may be stack memories such as high-bandwidth memories (HBM). The stack memories may be stacks of multiple ICs that may be electrically connected to one another via through silicon vias (TSVs).

In one or more embodiments, the number of second semiconductor chips 320 may be greater than the number of first semiconductor chips 310. For example, a plurality of second semiconductor chips 320 may be disposed around the first semiconductor chip 310. For example, as illustrated in FIG. 1, two second semiconductor chips 320 may be disposed on each of both sides of the first semiconductor chip 310.

The first semiconductor chip 310 may include first chip pads 312. The first chip pads 312 may be used to electrically connect the first semiconductor chip 310 to other elements of the semiconductor package according to one or more embodiments of the present disclosure. For example, the first chip pads 312 may be exposed at the bottom surface of the first semiconductor chip 310.

Each of the second semiconductor chips 320 may include second chip pads 322. The second chip pads 322 may be used to electrically connect the corresponding second semiconductor chip 320 to other elements of the semiconductor package according to one or more embodiments of the present disclosure. For example, the second chip pads 322 may be exposed at the bottom surface of the corresponding second semiconductor chip 320.

The first chip pads 312 and the second chip pads 322 may include a metal material such as, for example, Cu or Al, but the present disclosure is not limited thereto.

The first semiconductor chip 310 and the second semiconductor chips 320 may be mounted on the top surface of the interposer 200. In one or more embodiments, first chip bumps 390 may be formed between the interposer 200 and the first semiconductor chip 310. Second chip bumps 392 may be formed between the interposer 200 and the second semiconductor chip 320. The first chip bumps 390 may connect the upper pads 270 and the first chip pads 312. The second chip bumps 392 may connect the upper pads 270 and the second chip pads 322. In this manner, the first semiconductor chip 310 and the second semiconductor chips 320 may be electrically connected to the interposer 200.

The first chip bumps 390 and the second chip bumps 392 may be micro-bumps including a metal with a low melting point such as, for example, Sn or a Sn alloy, but the present disclosure is not limited thereto. The first chip bumps 390 and the second chip bumps 392 may have various shapes such as land, ball, pin, and pillar shapes. The first chip bumps 390 and the second chip bumps 392 may include under bump metallurgy (UBM), but the present disclosure is not limited thereto. In one or more embodiments, the first chip bumps 390 and the second chip bumps 392 may be formed on the same level.

In one or more embodiments, a second underfill 318 may be formed between the interposer 200 and the first semiconductor chip 310, and third underfills 328 may be formed between the interposer 200 and the second semiconductor chips 320. The second underfill 318 may fill or at least partially fill the space between the interposer 200 and the first semiconductor chip 310. The third underfills 328 may fill or at least partially fill the spaces between the interposer 200 and the second semiconductor chips 320. The second underfill 318 may cover or at least partially cover the first chip bumps 390. The third underfills 328 may cover or at least partially cover the second chip bumps 392. The second underfill 318 and the third underfills 328 may fix the first semiconductor chip 310 and the second semiconductor chips 320 and may thus prevent breakage of the first semiconductor chip 310 and the second semiconductor chips 320. The second underfill 318 and the third underfills 328 may include an insulating polymer material such as, for example, an EMC, but the present disclosure is not limited thereto.

A top surface 310US of the first semiconductor chip 310 may include a first region R1 and a second region R2. The first and second regions R1 and R2 do not overlap each other. FIGS. 1 and 2 illustrate that the second region R2 surrounds the first region R1 in a plan view, but the present disclosure is not limited thereto. For example, the first and second regions R1 and R2 may be disposed adjacent to each other in a first direction X. That is, the second region R2 may not surround the first region R1, but may be disposed adjacent to the first region R1.

The top surface 310US of the first semiconductor 310 may be disposed on the same plane as top surfaces 320US of the second semiconductor chips 320. That is, the top surface 310US of the first semiconductor 310 and the top surfaces 320US of the second semiconductor chips 320 may have the same or substantially the same height from the top surface of the package substrate 100. The top surface 310US of the first semiconductor 310 and the top surfaces 320US of the second semiconductor chips 320 may include Si.

The first pins 410 and the second pins 420 may be disposed on the first semiconductor chip 310. The first pins 410 and the second pins 420 may protrude from the top surface 310US of the first semiconductor chip 310. The first pins 410 and the second pins 420 may be protruding structures.

The first pins 410 may be disposed in the first region R1 of the top surface 310US of the first semiconductor chip 310. The second pins 420 may be disposed in the second region R2 of the top surface 310US of the first semiconductor chip 310. The top surface 310US of the first semiconductor chip 310 may be exposed between the first pins 410 and the second pins 420 (i.e., an area of the top surface 310US between the first pins 410 may be exposed, an area of the top surface 310US between the second pins 420 may be exposed, and an area of the top surface 310US that is between the first pins 410 and the second pins 420 (e.g., area 4120) may be exposed). That is, no particular elements may be disposed on the top surface 310US of the first semiconductor chip 310, between the first pins 410 and the second pins 420.

The first pins 410 and the second pins 420 may have a cylindrical shape. That is, in a plan view, the first pins 410 and the second pins 420 may have a circular shape, but the present disclosure is not limited thereto. Alternatively, the first pins 410 and the second pins 420 may have a polygonal shape in a plan view. For example, the first pins 410 and the second pins 420 may have a rectangular shape in a plan view.

The first pins 410 may be spaced apart from one another by a first distance D1 (e.g., substantially uniformly spaced apart). The first pins 410 may have a first width W1. The second pins 420 may be spaced apart from one another by a second distance D2 (e.g., substantially uniformly spaced apart). The second pins 420 may have a second width W2. The first width W1 of the first pins 410 may be greater than the second width W2 of the second pins 420.

The first distance D1 may be greater than the second distance D2. That is, the distance between the first pins 410 may be greater than the distance between the second pins 420. For example, the first distance D1 may be 0.1 μm to 100 μm. For example, the second distance D2 may be 10 μm or less.

The bottom surfaces of the first pins 410 and the bottom surfaces of the second pins 420 may be disposed on the same plane. The bottom surfaces of the first pins 410 and the bottom surfaces of the second pins 420 may be disposed on the same plane as the top surface 310US of the first semiconductor chip 310. The height of the first pins 410 and the second height of the second pins 420 may be the same or substantially the same. That is, top surfaces 410US of the first pins 410 and top surfaces 420US of the second pins 420 may be disposed on the same plane.

The first pins 410 and the second pins 420 may include a metal material. For example, the first pins 410 and the second pins 420 may include Cu. The first pins 410 and the second pins 420 may have thermal conductivity. The first pins 410 and the second pins 420 may include the same or substantially the same material, but the present disclosure is not limited thereto. Alternatively, the first pins 410 and the second pins 420 may include different materials.

Figure 3:
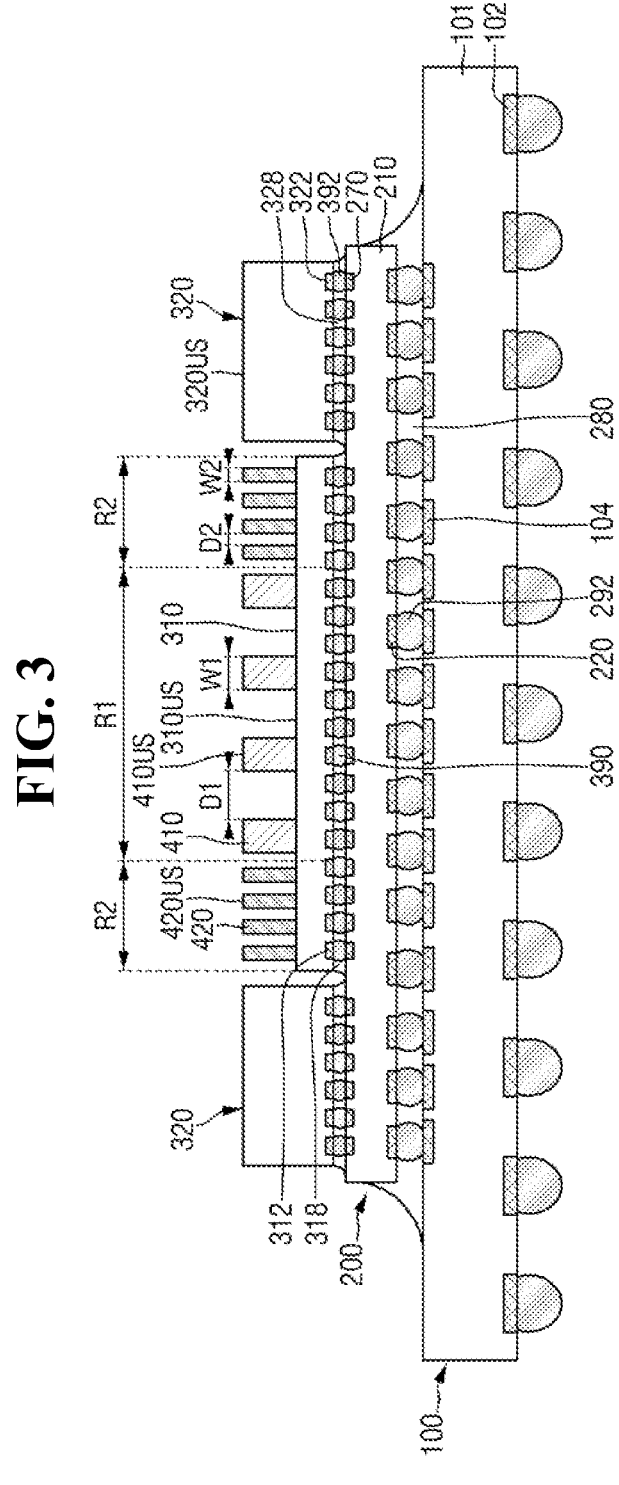
FIG. 3 is a cross-sectional view of a semiconductor package according to one or more embodiments of the present disclosure.

FIG. 3 is a cross-sectional view of a semiconductor package according to one or more embodiments of the present disclosure. For convenience, the embodiment of FIG. 3 will hereinafter be described, focusing mainly on the differences with the embodiment of FIGS. 1 and 2, and repeated descriptions may be omitted.

Referring to FIG. 3, a top surface 310US of a first semiconductor chip 310 may not be disposed on the same plane as top surfaces 320US of second semiconductor chips 320. The top surface 310US of the first semiconductor chip 310 may be disposed below the top surfaces 320US of the second semiconductor chips 320, with respect to the top surface of a package substrate 100.

Top surfaces 410US of first pins 410 and top surfaces 420US of second pins 420 may be disposed on the same plane as the top surfaces 320US of the second semiconductor chips 320, but the present disclosure is not limited thereto. Alternatively, the top surfaces 410US of the first pins 410 and the top surfaces 420US of the second pins 420 may be disposed above the top surfaces 320US of the second semiconductor chips 320.

Figure 4:
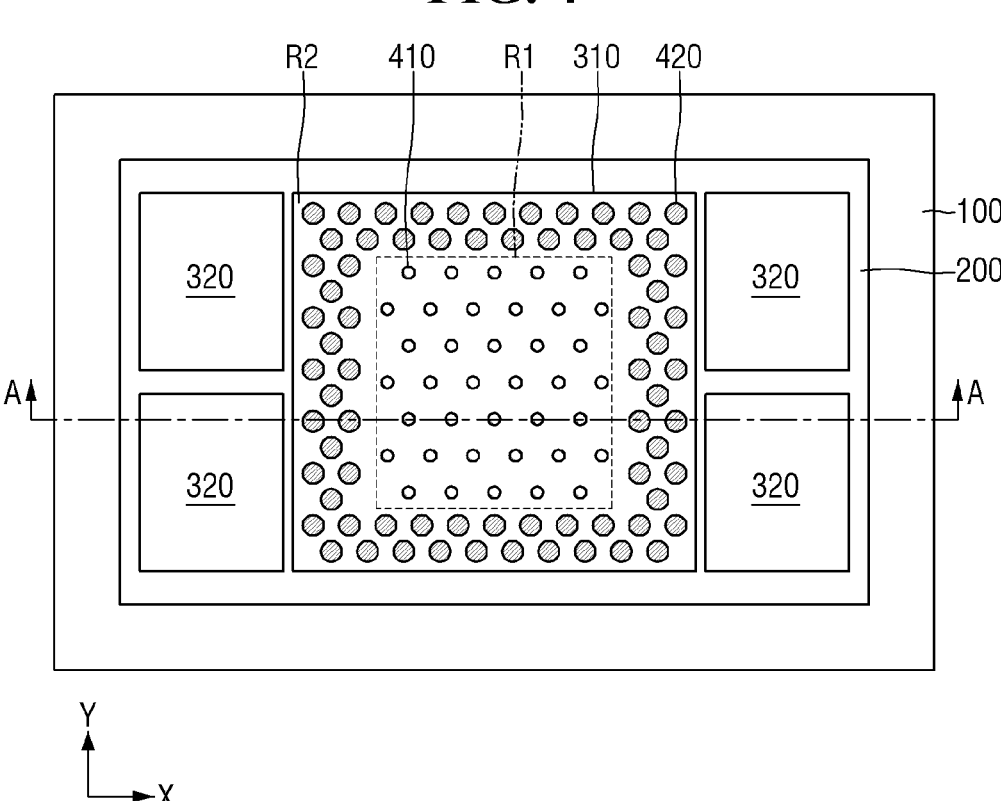
FIG. 4 is a layout view of a semiconductor package according to one or more embodiments of the present disclosure.
Figure 5:
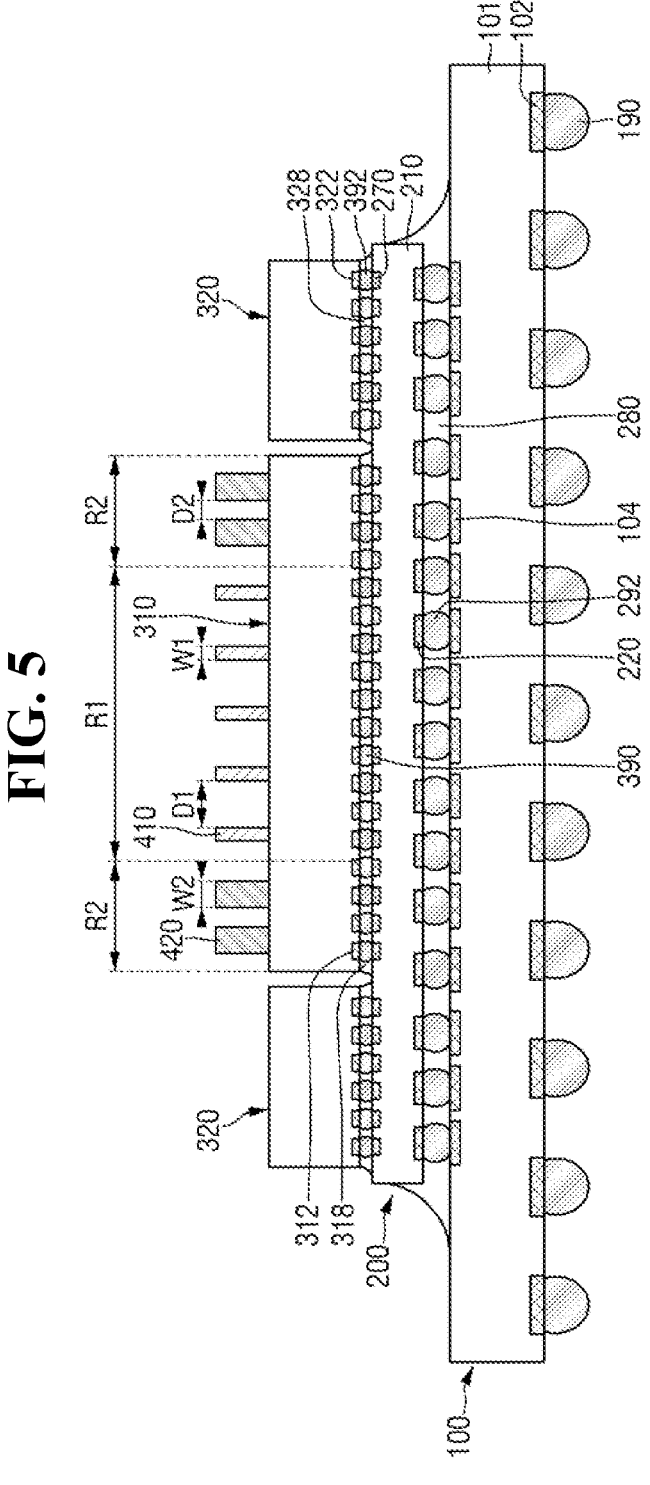
FIG. 5 is a cross-sectional view taken along line A-A of FIG. 4 according to one or more embodiments of the present disclosure.

FIG. 4 is a layout view of a semiconductor package according to one or more embodiments of the present disclosure. FIG. 5 is a cross-sectional view taken along line A-A of FIG. 4. For convenience, the embodiment of FIGS. 4 and 5 will hereinafter be described, focusing mainly on the differences with the embodiment of FIGS. 1 and 2, and repeated descriptions may be omitted.

Referring to FIGS. 4 and 5, a first width W1 of first pins 410 may be less than a second width W2 of second pins 420. A first distance D1 between the first pins 410 may be greater than a second distance D2 between the second pins 420. That is, the second pins 420 may be more densely arranged than the first pins 410. The first pins 410 may be more sparsely arranged than the second pins 420.

Figure 6:
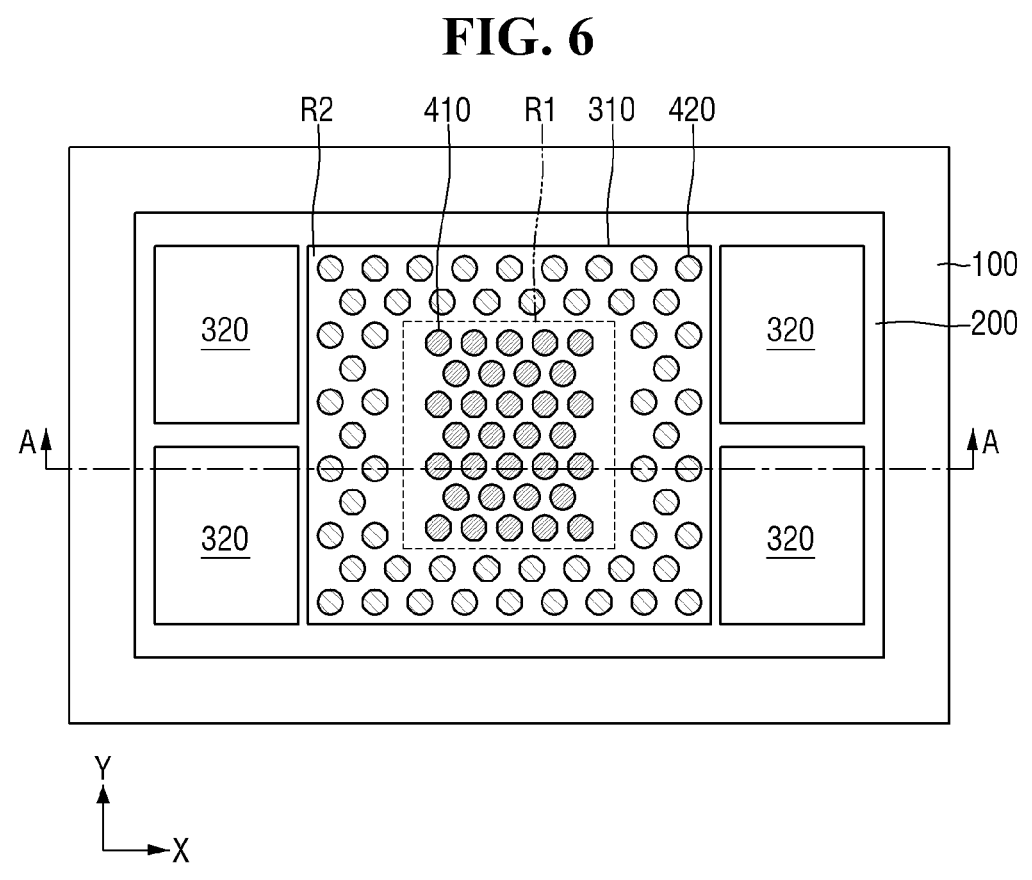
Figure 7:
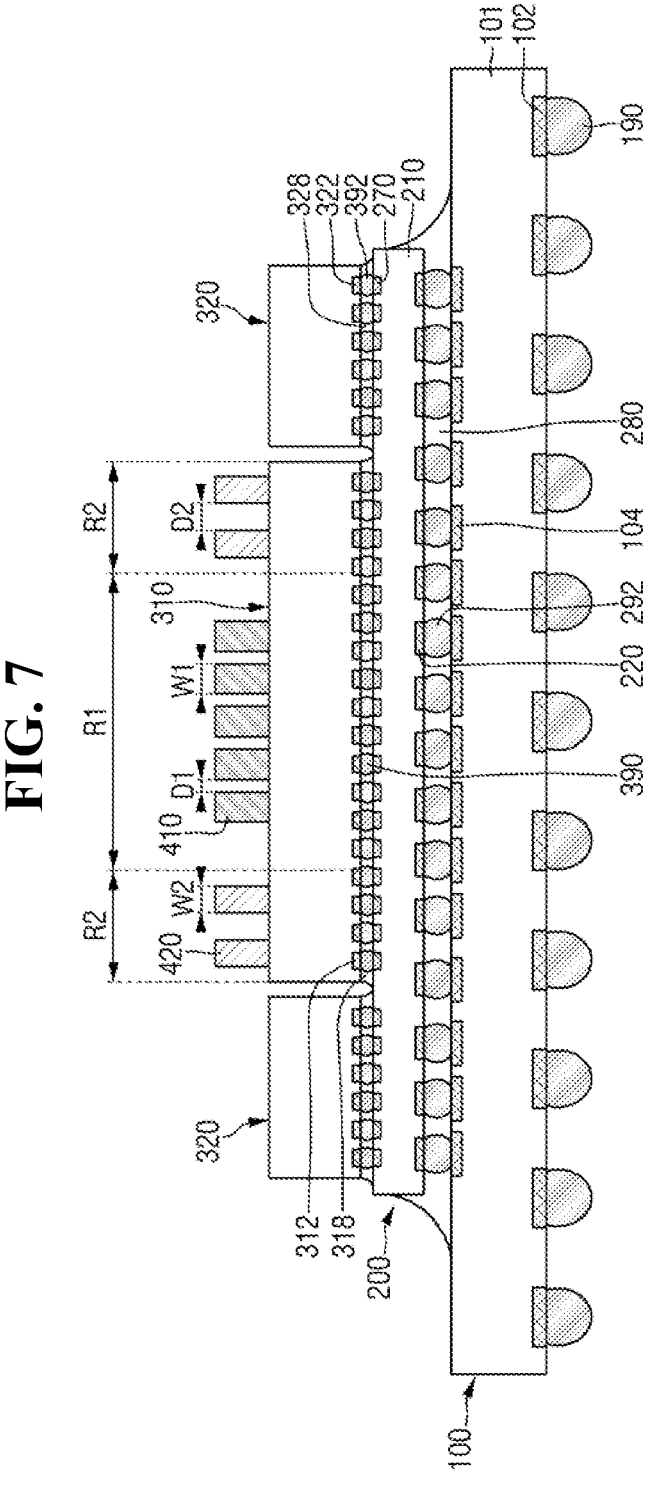
FIG. 7 is a cross-sectional view taken along line A-A of FIG. 6 according to one or more embodiments of the present disclosure.

FIG. 6 is a layout view of a semiconductor package according to one or more embodiments of the present disclosure. FIG. 7 is a cross-sectional view taken along line A-A of FIG. 6. For convenience, the embodiment of FIGS. 6 and 7 will hereinafter be described, focusing mainly on the differences with the embodiment of FIGS. 1 and 2, and repeated descriptions may be omitted.

Referring to FIGS. 6 and 7, a first width W1 of first pins 410 may be the same or substantially the same as a second width W2 of second pins 420. A first distance between the first pins 410 may be less than a second distance D2 between the second pins 420. That is, the first pins 410 may be more densely arranged than the second pins 420. The second pins 420 may be more sparsely arranged than the first pins 410.

Figure 8:
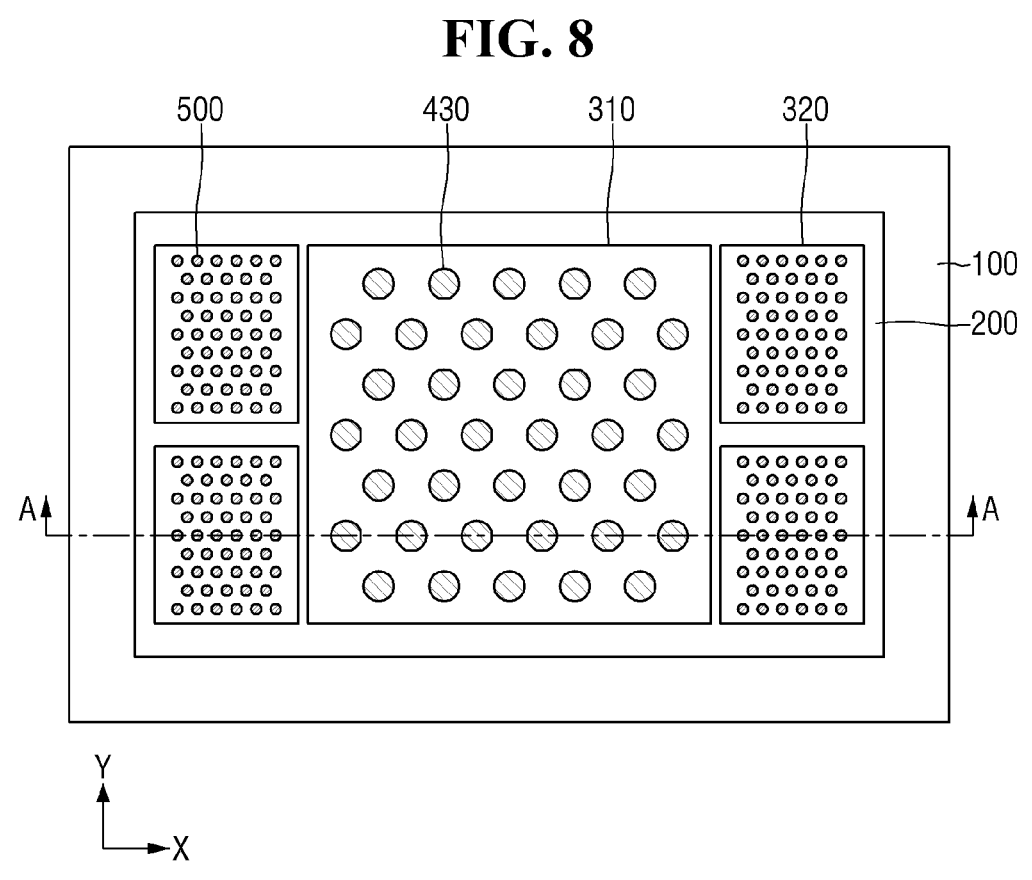
Figure 9:
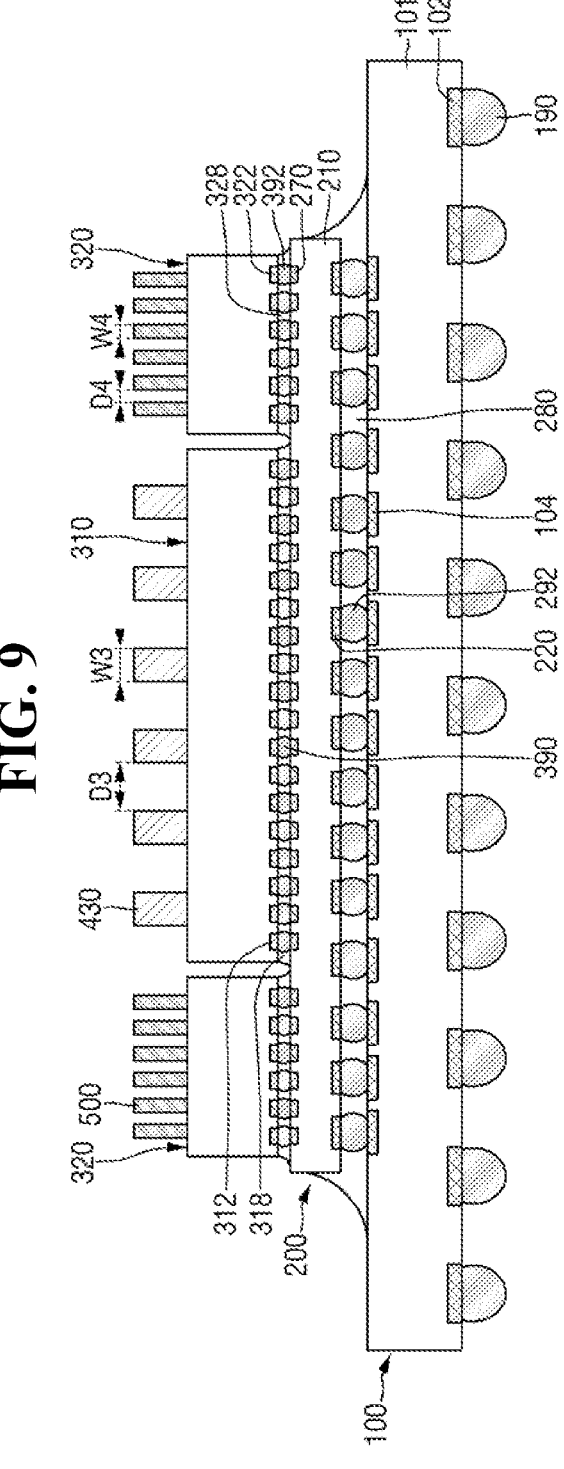
FIG. 9 is a cross-sectional view taken along line A-A of FIG. 8 according to one or more embodiments of the present disclosure.

FIG. 8 is a layout view of a semiconductor package according to one or more embodiments of the present disclosure. FIG. 9 is a cross-sectional view taken along line A-A of FIG. 8. For convenience, the embodiment of FIGS. 8 and 9 will hereinafter be described, focusing mainly on the differences with the embodiment of FIGS. 1 and 2, and repeated descriptions may be omitted.

Referring to FIGS. 8 and 9, the semiconductor package according to one or more embodiments of the present disclosure may include third pins 430 and fourth pins 500.

The third pins 430 may be disposed on a first semiconductor chip 310. The third pins 430 may be disposed on the top surface of the first semiconductor chip 310. The fourth pins 500 may be disposed on second semiconductor chips 320. The fourth pins 500 may be disposed on the top surfaces of the second semiconductor chips 320.

The third pins 430 may be spaced apart from one another by a third distance D3. The third pins 430 may have a third width W3. The fourth pins 500 may be spaced apart from one another by a fourth distance D4. The fourth pins 500 may have a fourth width W4. The third width W3 of the third pins 430 may be greater than the fourth width W4 of the fourth pins 500.

The third distance D3 may be greater than the fourth width D4. That is, the distance between the third pins 430 may be greater than the distance between the fourth pins 500. For example, the third distance D3 may be about 0.1 μm to about 100 μm. For example, the fourth distance D4 may be about 10 μm or less.

Figure 10:
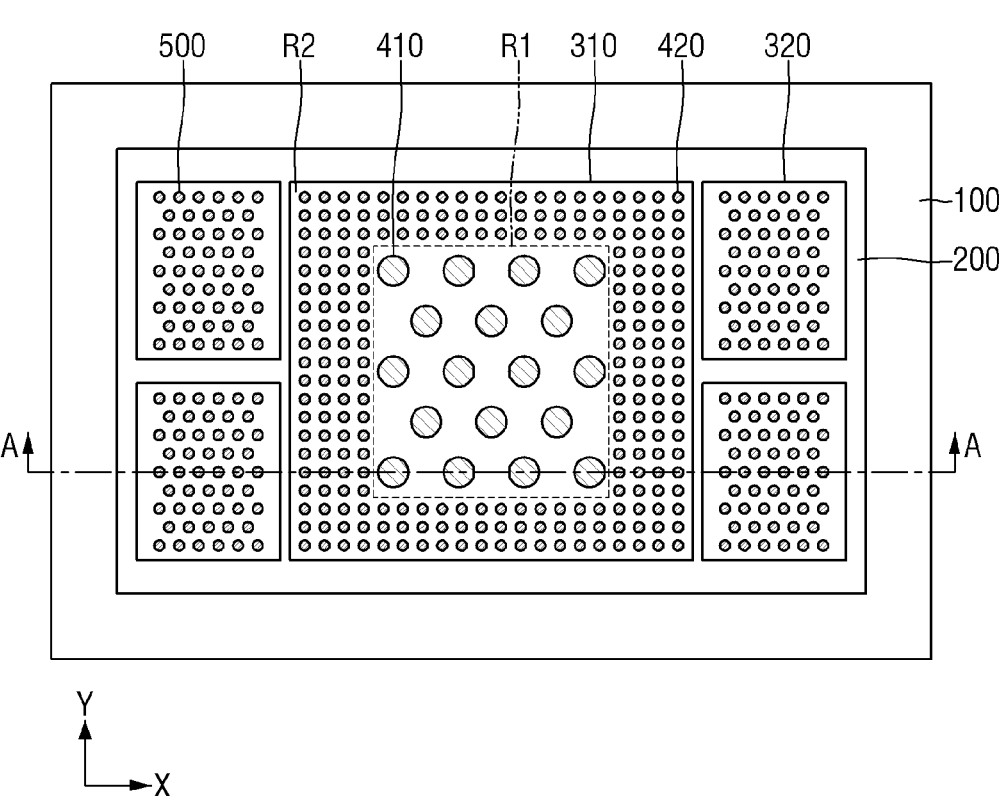
FIG. 10 is a layout view of a semiconductor package according to one or more embodiments of the present disclosure.
Figure 11:
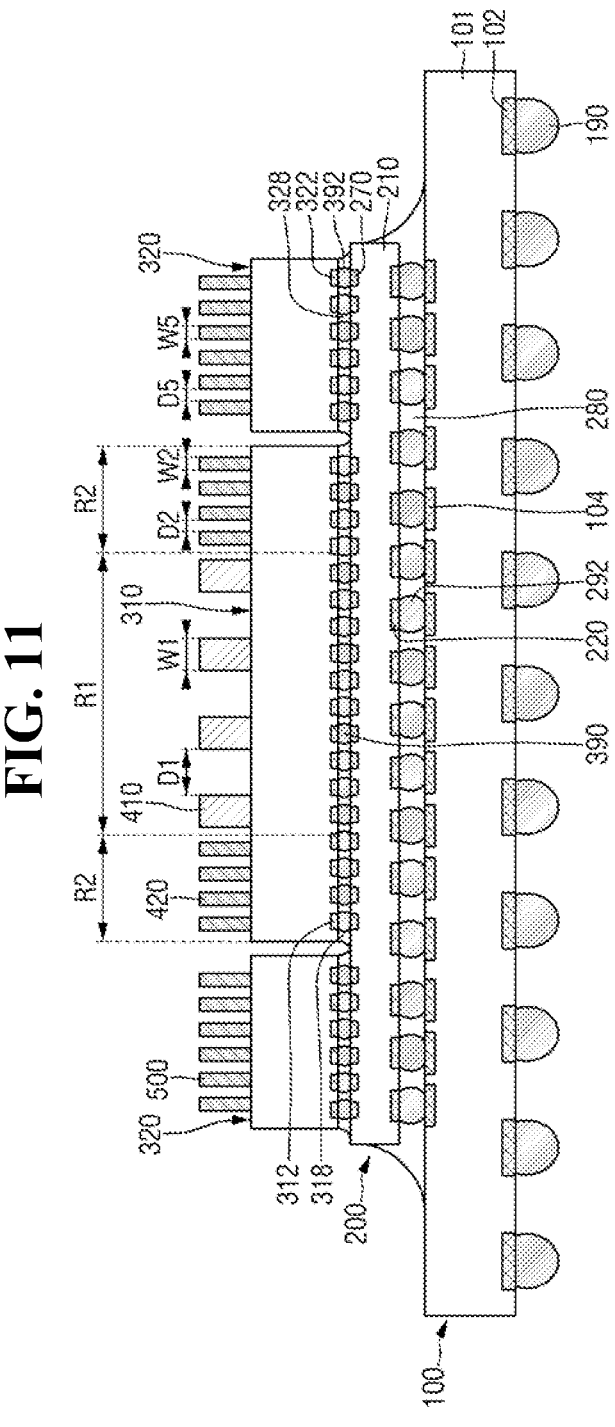
FIG. 11 is a cross-sectional view taken along line A-A of FIG. 10 according to one or more embodiments of the present disclosure.

FIG. 10 is a layout view of a semiconductor package according to one or more embodiments of the present disclosure. FIG. 11 is a cross-sectional view taken along line A-A of FIG. 10. For convenience, the embodiment of FIGS. 10 and 11 will hereinafter be described, focusing mainly on the differences with the embodiments of FIGS. 1, 2, 8, and 9, and repeated descriptions may be omitted.

Referring to FIGS. 10 and 11, the semiconductor package according to one or more embodiments of the present disclosure may include first pins 410, second pins 420, and fourth pins 500.

The first pins 410 may be spaced apart from one another by a first distance D1. The first pins 410 may have a first width W1. The second pins 420 may be spaced apart from one another by a second distance D2. The second pins 420 may have a second width W2. The fourth pins 500 may be spaced apart from one another by a fifth distance D5. The fourth pins 500 may have a fifth width W5.

The first distance D1 may be greater than the second distance D2. The first distance D1 may be greater than the fifth distance D5. FIGS. 10 and 11 illustrate that the second and fifth distances D2 and D5 are the same, but the present disclosure is not limited thereto. Alternatively, the second distance D2 may be greater than the fifth distance D5. Alternatively, the second distance D2 may be less than the fifth distance D5.

The first width W1 of the first pins 410 may be greater than the second width W2 of the second pins 420. The first width W1 of the first pins 410 may be greater than the fifth width W5 of the fourth pins 500. FIGS. 10 and 11 illustrate that the second width W2 of the second pins 420 and the fifth width W5 of the fourth pins 500 are the same, but the present disclosure is not limited thereto.

Figure 12:
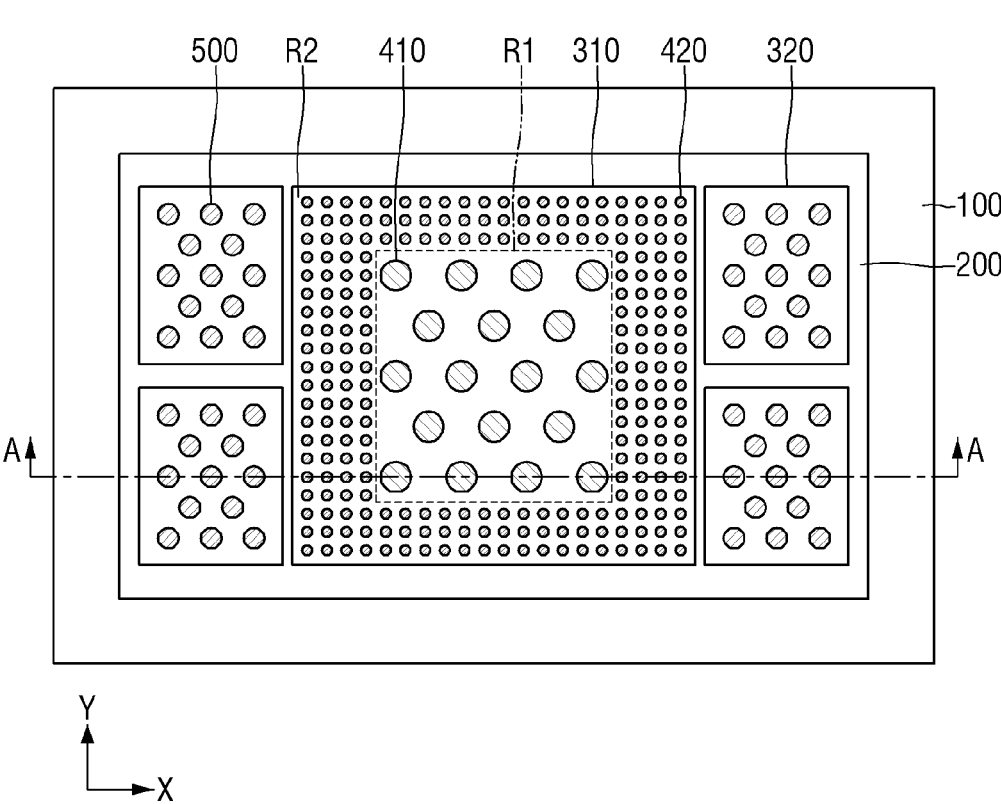
FIG. 12 is a layout view of a semiconductor package according to one or more embodiments of the present disclosure.
Figure 13:
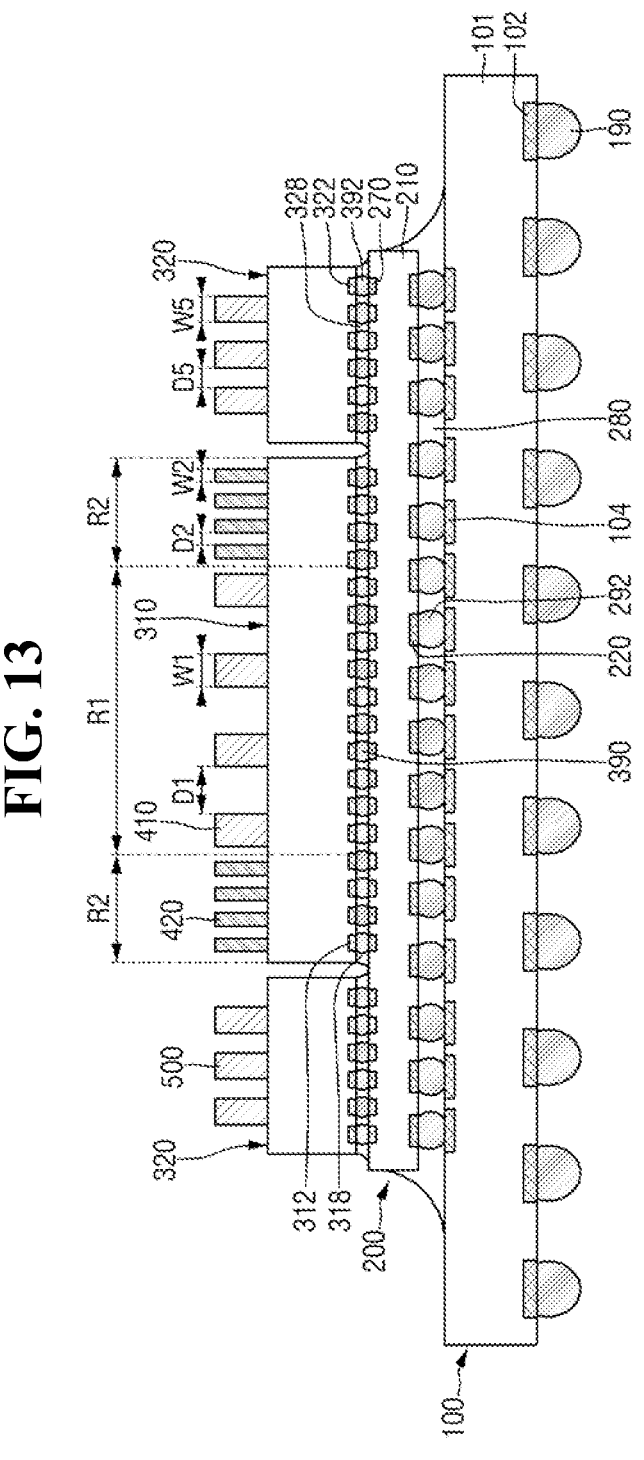
FIG. 13 is a cross-sectional view taken along line A-A of FIG. 12 according to one or more embodiments of the present disclosure.

FIG. 12 is a layout view of a semiconductor package according to one or more embodiments of the present disclosure. FIG. 13 is a cross-sectional view taken along line A-A of FIG. 12. For convenience, the embodiment of FIGS. 12 and 13 will hereinafter be described, focusing mainly on the differences with the embodiment of FIGS. 10 and 11, and repeated descriptions may be omitted.

Referring to FIGS. 12 and 13, a second width W2 of second pins 420 may be less than a fifth width W5 of fourth pins 500. The fifth width W5 of the fourth pins 500 may be greater than the second width W2 of the second pins 420 and less than a first width W1 of first pins 410.

A first distance D1 may be greater than a second distance D2. The first distance D1 may be greater than a fifth distance D5. The fifth distance D5 may be greater than the second distance D2.

Figure 14:
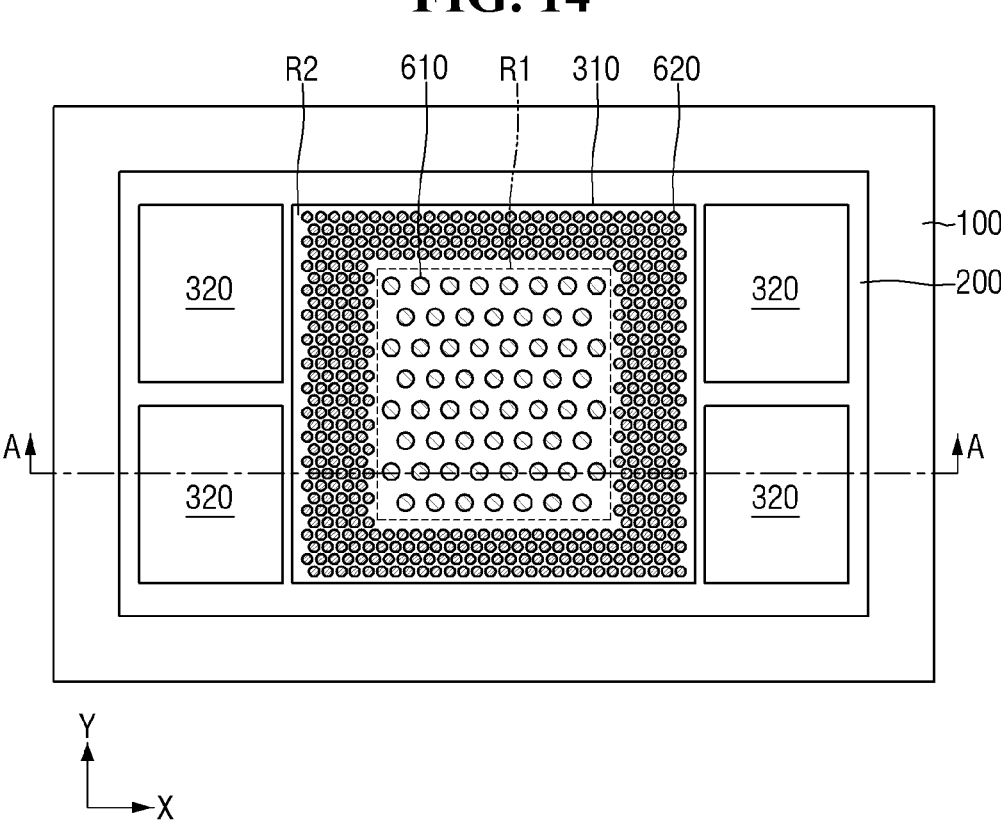
FIG. 14 is a layout view of a semiconductor package according to one or more embodiments of the present disclosure.
Figure 15:
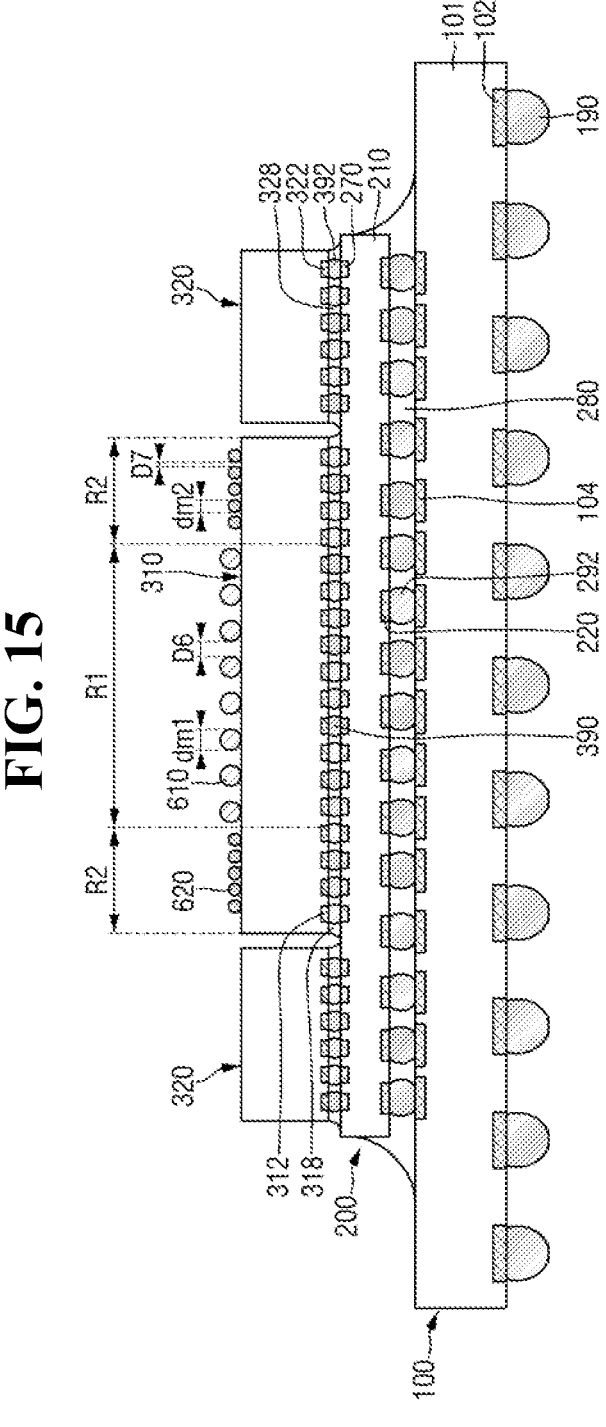
FIG. 15 is a cross-sectional view taken along line A-A of FIG. 14 according to one or more embodiments of the present disclosure.

FIG. 14 is a layout view of a semiconductor package according to one or more embodiments of the present disclosure. FIG. 15 is a cross-sectional view taken along line A-A of FIG. 14. For convenience, the embodiment of FIGS. 14 and 15 will hereinafter be described, focusing mainly on the differences with the embodiment of FIGS. 1 and 2, and repeated descriptions may be omitted.

Referring to FIGS. 14 and 15, the semiconductor package according to one or more embodiments of the present disclosure may include first spheres 610 and second spheres 620. The first spheres 610 and the second spheres 620 may have a spherical shape.

The first spheres 610 and the second spheres 620 may be disposed on a first semiconductor chip 310. The first spheres 610 and the second spheres 620 may protrude from the top surface of the first semiconductor chip 310. The first spheres 610 and the second spheres 620 may be protruding structures. The first spheres 610 and the second spheres 620 may form single layers. A layer of the first spheres 610 and a layer of the second spheres 620 may be disposed on the top surface of the first semiconductor chip 310.

The first spheres 610 may be disposed in a first region R1 of the top surface of the first semiconductor chip 310. The second spheres 620 may be disposed in a second region R2 of the top surface of the first semiconductor chip 310.

The first spheres 610 may be spaced apart from one another by a sixth distance D6. The first spheres 610 may have a first diameter dm1. The second spheres 620 may be spaced apart from one another by a seventh distance D7. The second spheres 620 may have a second diameter dm2. The first diameter dm1 may be greater than the second diameter dm2.

The sixth distance D6 may be greater than the seventh distance D7. That is, the distance between the first spheres 610 may be greater than the distance between the second spheres 620. For example, the sixth distance D6 may be about 0.1 μm to about 100 μm. For example, the seventh distance D7 may be about 10 μm or less.

Figure 16:
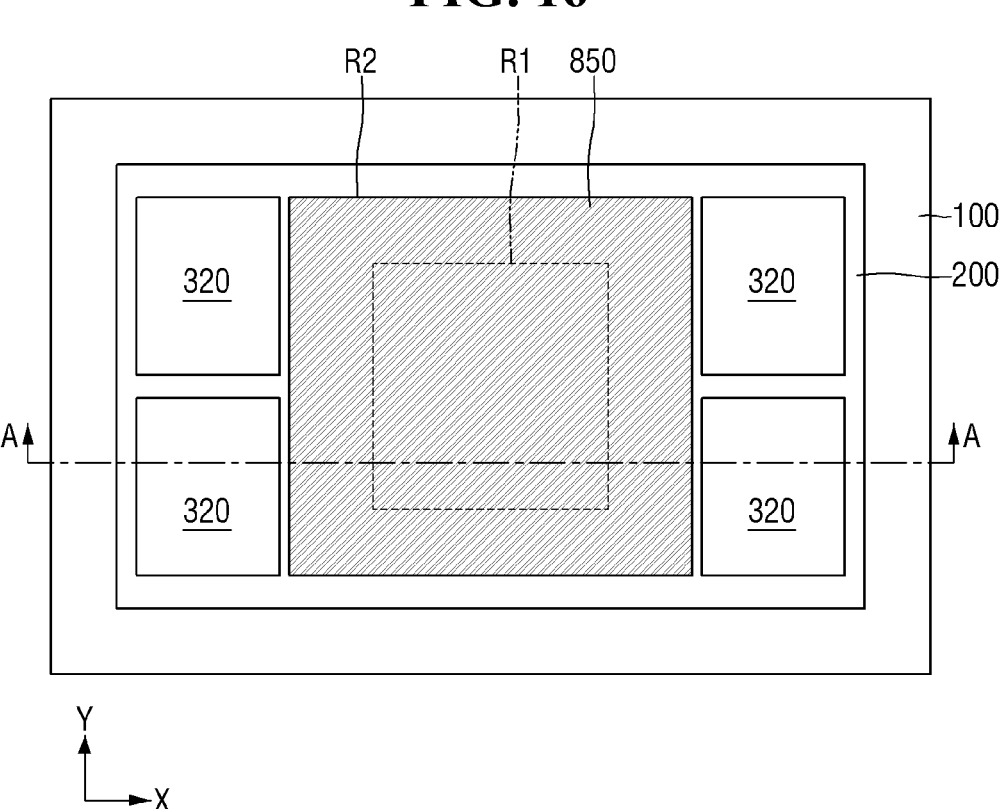
FIG. 16 is a layout view of a semiconductor package according to one or more embodiments of the present disclosure.
Figure 17:
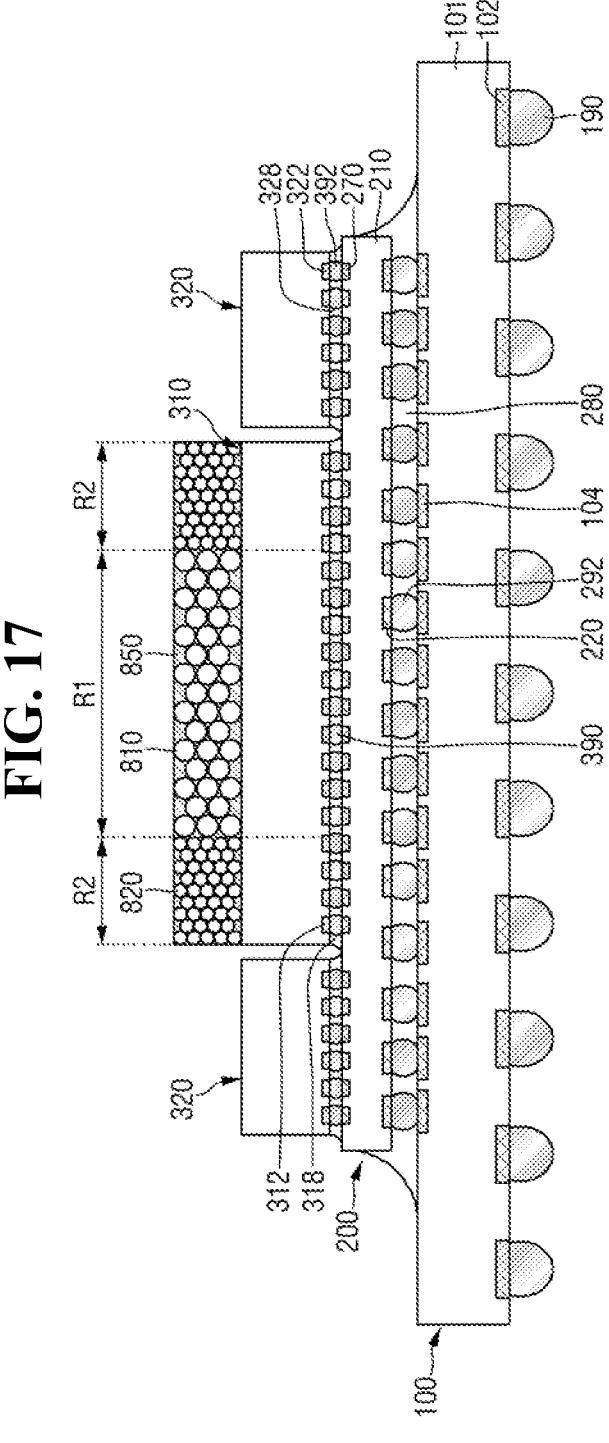
FIG. 17 is a cross-sectional view taken along line A-A of FIG. 16 according to one or more embodiments of the present disclosure.

FIG. 16 is a layout view of a semiconductor package according to one or more embodiments of the present disclosure. FIG. 17 is a cross-sectional view taken along line A-A of FIG. 16. For convenience, the embodiment of FIGS. 16 and 17 will hereinafter be described, focusing mainly on the differences with the embodiment of FIGS. 14 and 15, and repeated descriptions may be omitted.

Referring to FIGS. 16 and 17, the semiconductor package according to one or more embodiments of the present disclosure may include a first mold film 850, first holes 810, and second holes 820. The first mold film 850 may be disposed on a first semiconductor chip 310. The first mold film 850 may cover or at least partially cover the top surface of the first semiconductor chip 310. The first mold film 850 may include at least one of Si, a Si compound, and a metal material.

The first holes 810 and the second holes 820 may be disposed in the first mold film 850. The first holes 810 and the second holes 820 may form a plurality of voids in the first mold film 850.

The first holes 810 may be disposed in a first region R1. The first holes 810 may include a plurality of layers of voids that are stacked in the first mold film 850, in the first region R1. The second holes 820 may be disposed in a second region R2. The second holes 820 may include a plurality of layers of voids that are stacked in the first mold film 850, in the second region R2.

The diameter of the first holes 810 may be greater than the diameter of the second holes 820. The size of the voids formed by the first holes 810 in the first mold film 850 may be greater than the size of the voids formed by the second holes 820 in the first mold film 850.

Figure 18:
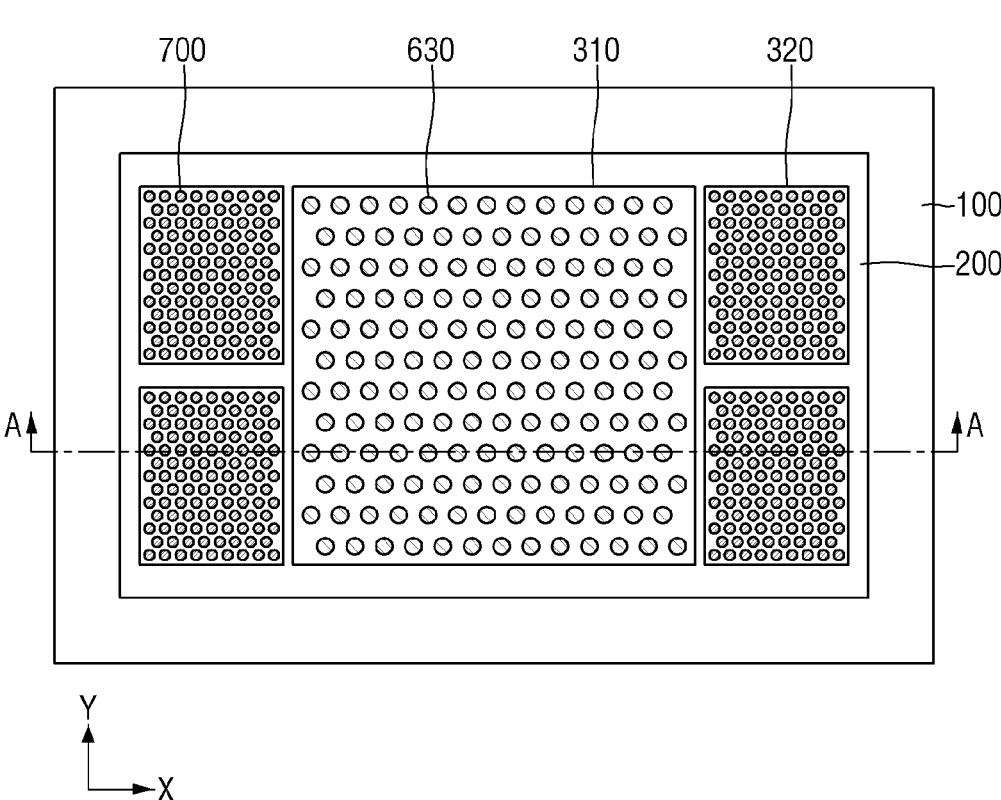
FIG. 18 is a layout view of a semiconductor package according to one or more embodiments of the present disclosure.
Figure 19:
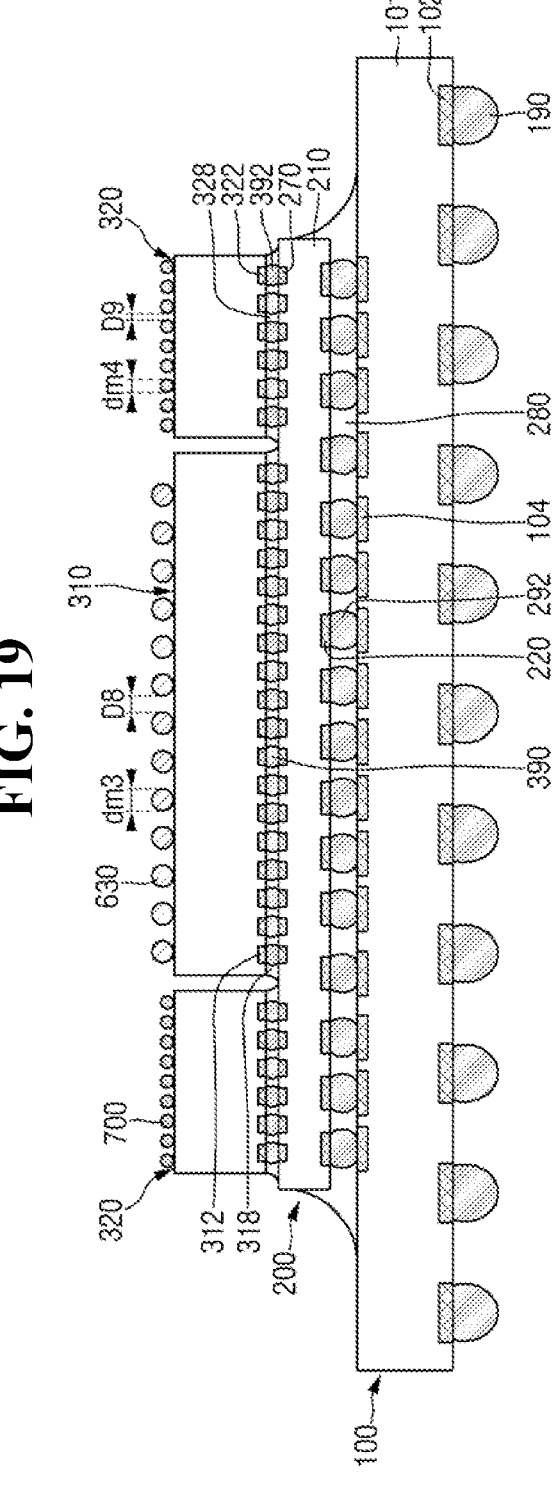
FIG. 19 is a cross-sectional view taken along line A-A of FIG. 18 according to one or more embodiments of the present disclosure.

FIG. 18 is a layout view of a semiconductor package according to one or more embodiments of the present disclosure. FIG. 19 is a cross-sectional view taken along line A-A of FIG. 18. For convenience, the embodiment of FIGS. 18 and 19 will hereinafter be described, focusing mainly on the differences with the embodiment of FIGS. 14 and 15, and repeated descriptions may be omitted.

Referring to FIGS. 18 and 19, the semiconductor package according to one or more embodiments of the present disclosure may include third spheres 630 and fourth spheres 700.

The third spheres 630 may be disposed on a first semiconductor chip 310. The third spheres 630 may be disposed on the top surface of the first semiconductor chip 310. The fourth spheres 700 may be disposed on second semiconductor chips 320. The fourth spheres 700 may be disposed on the top surfaces of the second semiconductor chips 320.

The third spheres 630 may be spaced apart from one another by an eighth distance D8. The third spheres 630 may have a third diameter dm3. The fourth spheres 700 may be spaced apart from one another by a ninth distance D9. The fourth spheres 700 may have a fourth diameter dm4. The third diameter dm3 of the third spheres 630 may be greater than the fourth diameter dm4 of the fourth spheres 700.

The eighth distance D8 may be greater than the ninth distance D9. That is, the distance between the third spheres 630 may be greater than the distance between the fourth spheres 700. For example, the eighth distance D8 may be about 0.1 μm to about 100 μm. For example, the ninth distance D9 may be about 10 μm or less.

Figure 20:
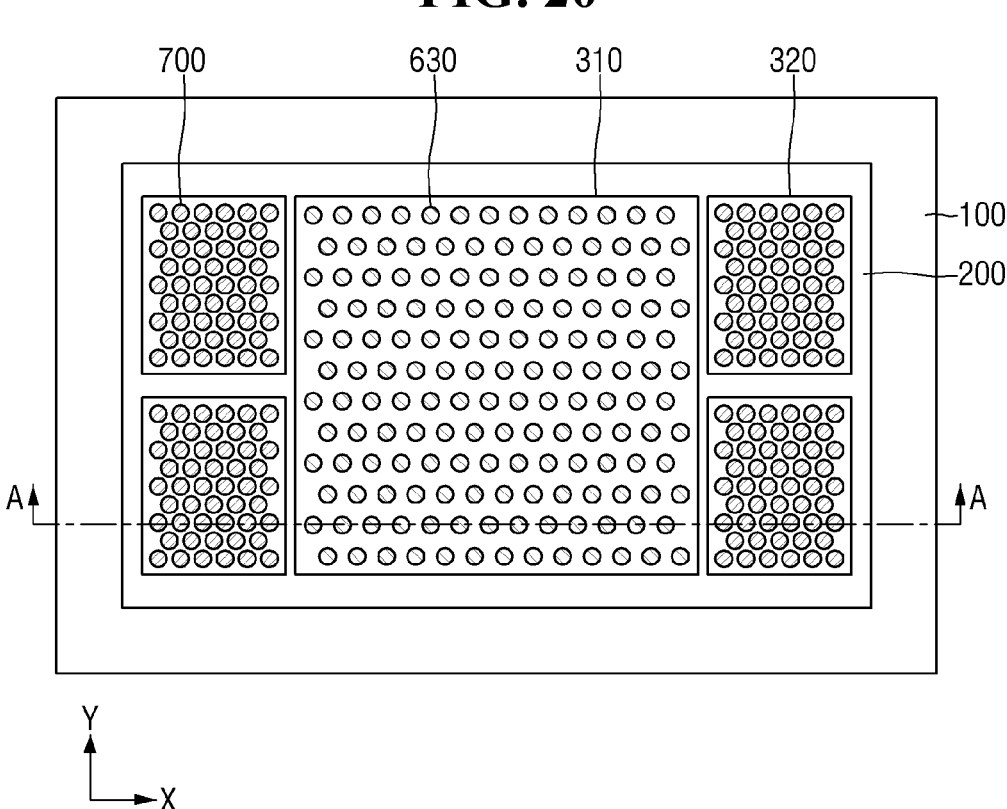
FIG. 20 is a layout view of a semiconductor package according to one or more embodiments of the present disclosure.
Figure 21:
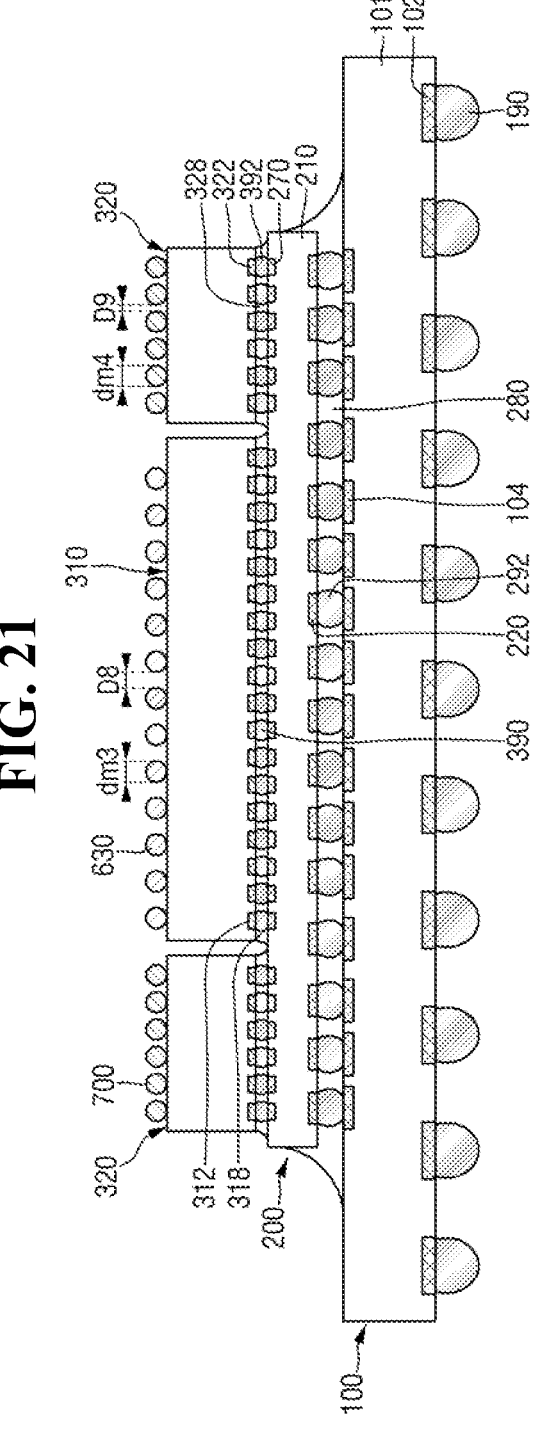
FIG. 21 is a cross-sectional view taken along line A-A of FIG. 20 according to one or more embodiments of the present disclosure.

FIG. 20 is a layout view of a semiconductor package according to one or more embodiments of the present disclosure. FIG. 21 is a cross-sectional view taken along line A-A of FIG. 20. For convenience, the embodiment of FIGS. 20 and 21 will hereinafter be described, focusing mainly on the differences with the embodiment of FIGS. 18 and 19, and repeated descriptions may be omitted.

Referring to FIGS. 20 and 21, a third diameter dm3 of third spheres 630 may be the same or substantially the same as a fourth diameter dm4 of fourth spheres 700. The distance between the third spheres 630 may be greater than the distance between the fourth spheres 700. An eighth distance d8 may be greater than a ninth distance D9. That is, the third spheres 630 may be less densely arranged than the fourth spheres 700. The fourth spheres 700 may be more densely arranged than the third spheres 630.

Figure 22:
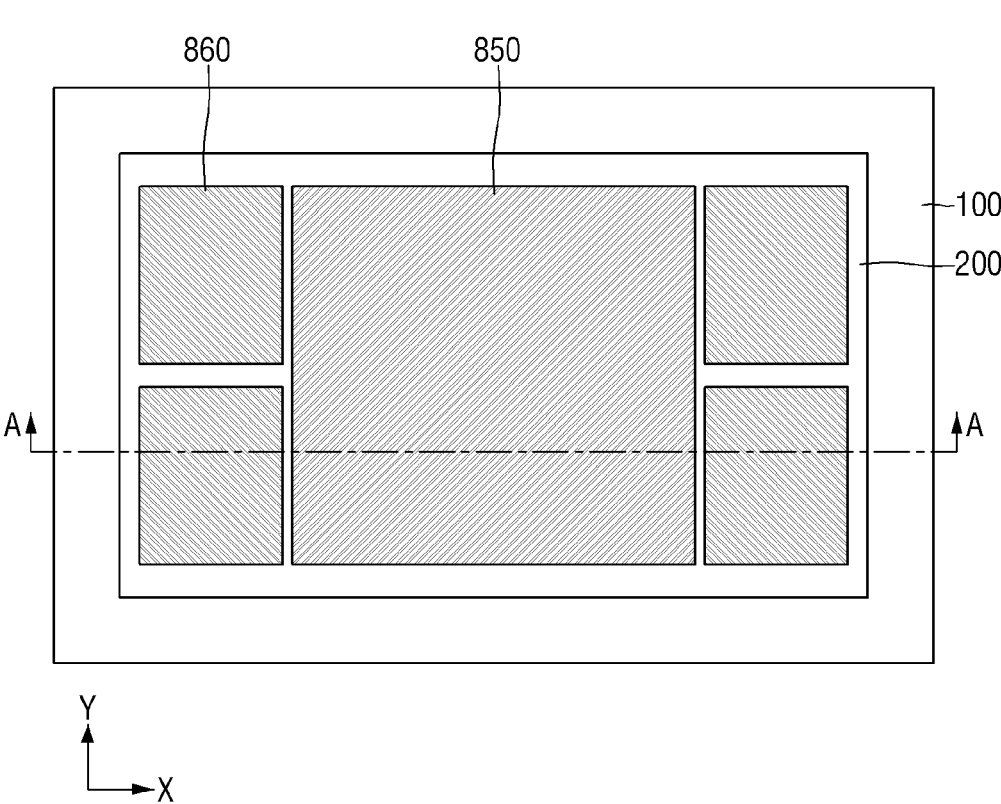
FIG. 22 is a layout view of a semiconductor package according to one or more embodiments of the present disclosure.
Figure 23:
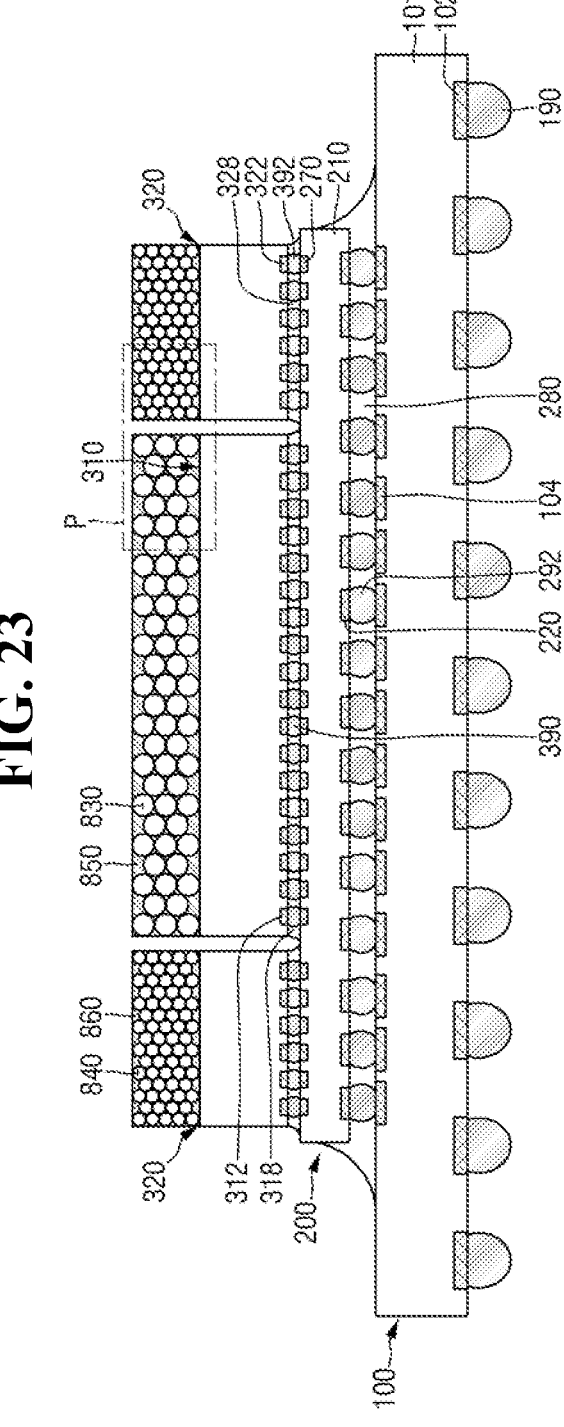
FIG. 23 is a cross-sectional view taken along line A-A of FIG. 22 according to one or more embodiments of the present disclosure.
Figure 24:
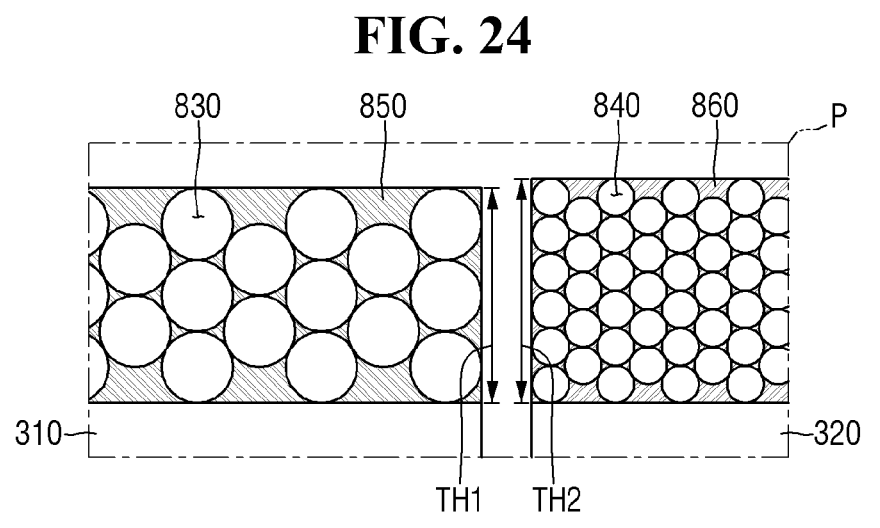

FIG. 22 is a layout view of a semiconductor package according to one or more embodiments of the present disclosure. FIG. 23 is a cross-sectional view taken along line A-A of FIG. 22. FIG. 24 is an enlarged cross-sectional view of an area P of FIG. 23. For convenience, the embodiment of FIGS. 22 through 24 will hereinafter be described, focusing mainly on the differences with the embodiment of FIGS. 18 and 19, and repeated descriptions may be omitted.

Referring to FIGS. 22 through 24, the semiconductor package according to one or more embodiments of the present disclosure may include a first mold film 850, a second mold film 860, third holes 830, and fourth holes 840. The first mold film 850 may be disposed on a first semiconductor chip 310. The first mold film 850 may cover or at least partially cover the top surface of the first semiconductor chip 310. The second mold film 860 may be disposed on second semiconductor chips 320. The second mold films 860 may cover or at least partially cover the top surfaces of the second semiconductor chips 320. The first and second mold films 850 and 860 may include at least one of Si, a Si compound, and a metal material.

Figure 25:
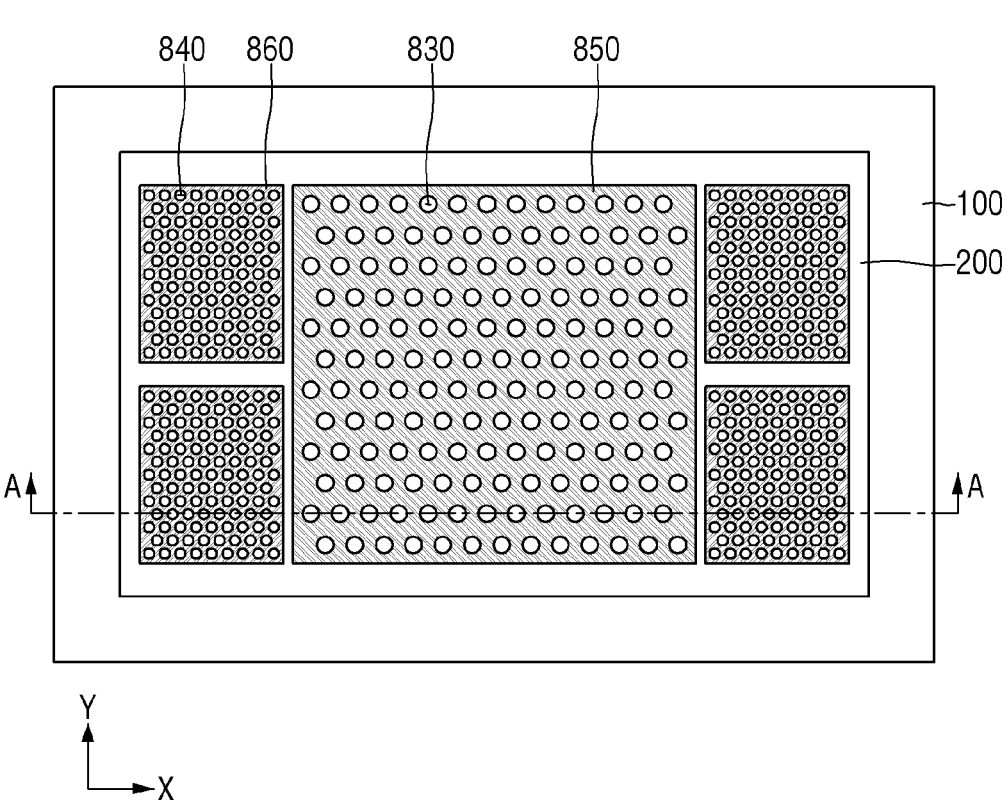
FIG. 25 is a layout view of a semiconductor package according to one or more embodiments of the present disclosure.

The first and second mold films 850 and 860 may have different heights. A first thickness TH1 from the top surface of the first semiconductor chip 310 to the top surface of the first mold film 850 may differ from a second thickness TH2 from the top surfaces of the second semiconductor chips 320 to the top surface of the second mold film 860. For example, the first thickness TH1 may be less than the second thickness TH2. FIGS. 24 and 25 illustrate that the first thickness TH1 is less than the second thickness TH2, but the present disclosure is not limited thereto. Alternatively, the first thickness TH1 may be greater than the second thickness TH2.

The third holes 830 may be disposed in the first mold film 850. The third holes 830 may form a plurality of voids in the first mold film 850. The third holes 830 may include a plurality of layers of voids that are stacked in the first mold film 850.

The fourth holes 840 may be disposed in the second mold film 860. The fourth holes 840 may form a plurality of voids in the second mold film 860. The fourth holes 840 may include a plurality of layers of voids that are stacked in the second mold film 860.

The diameter of the third holes 830 may be greater than the diameter of the fourth holes 840. The size of the voids formed by the third holes 830 in the first mold film 850 may be greater than the size of the voids formed by the fourth holes 840 in the second mold film 860.

Figure 26:
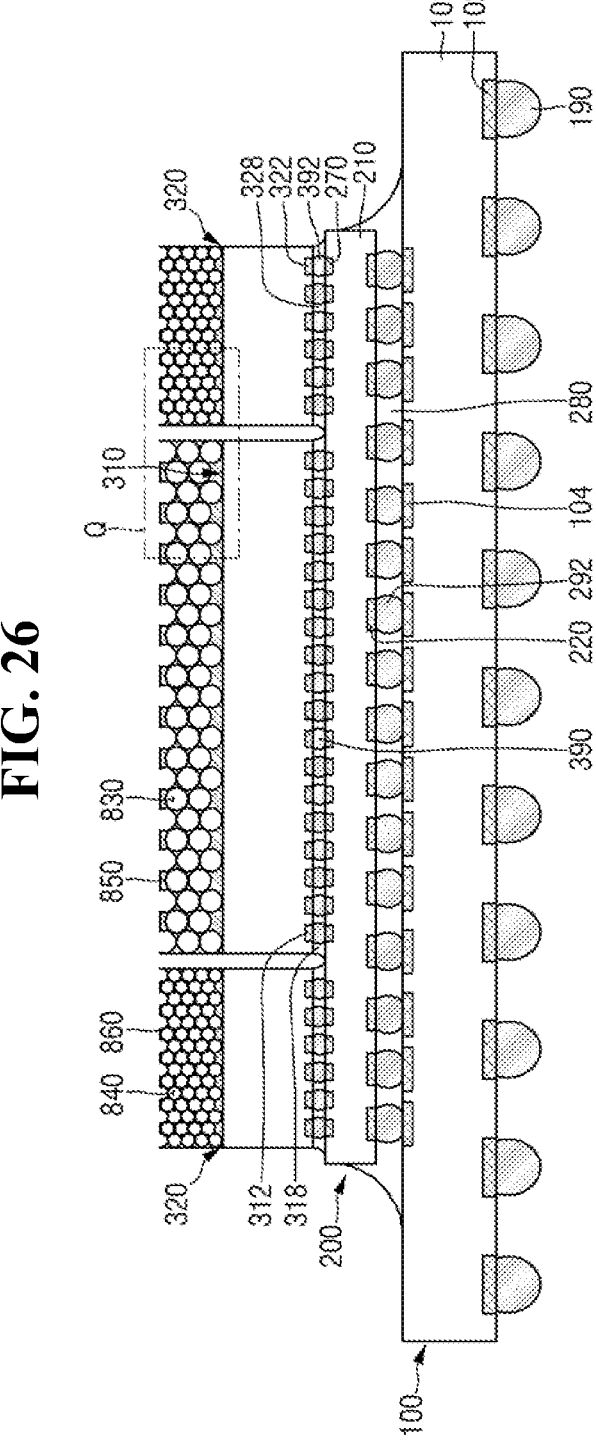
FIG. 26 is a cross-sectional view taken along line A-A of FIG. 25 according to one or more embodiments of the present disclosure.
Figure 27:
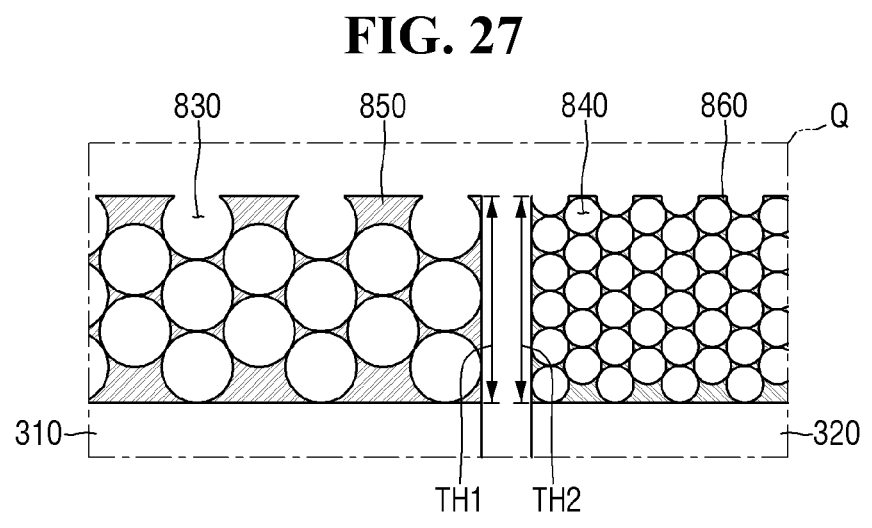

FIG. 25 is a layout view of a semiconductor package according to one or more embodiments of the present disclosure. FIG. 26 is a cross-sectional view taken along line A-A of FIG. 25. FIG. 27 is an enlarged cross-sectional view of an area Q of FIG. 26. For convenience, the embodiment of FIGS. 25 through 27 will hereinafter be described, focusing mainly on the differences with the embodiment of FIGS. 22 through 24, and repeated descriptions may be omitted.

Referring to FIGS. 25 through 27, first and second mold films 850 and 860 may have the same or substantially the same height. A first thickness from the top surface of a first semiconductor chip 310 to the top surface of the first mold film 850 may be the same or substantially the same as a second thickness TH2 from the top surfaces of second semiconductor chips 320 to the top surface of the second mold film 860.

Figure 28:
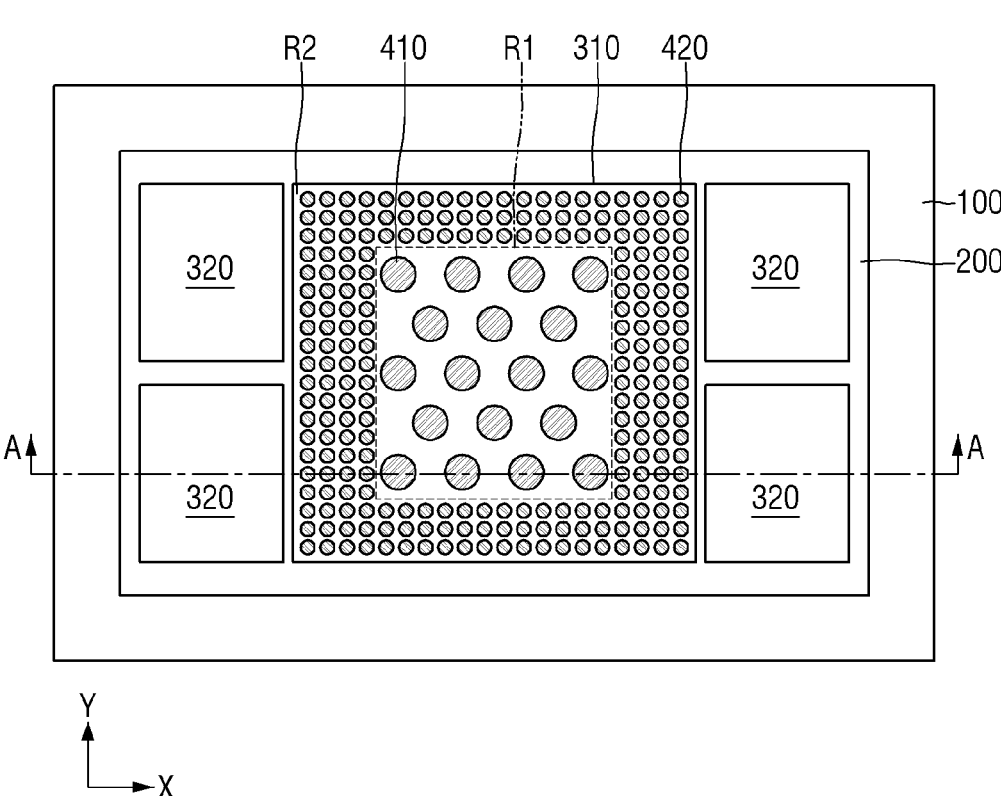
FIG. 28 is a layout view of a semiconductor package according to one or more embodiments of the present disclosure.
Figure 29:
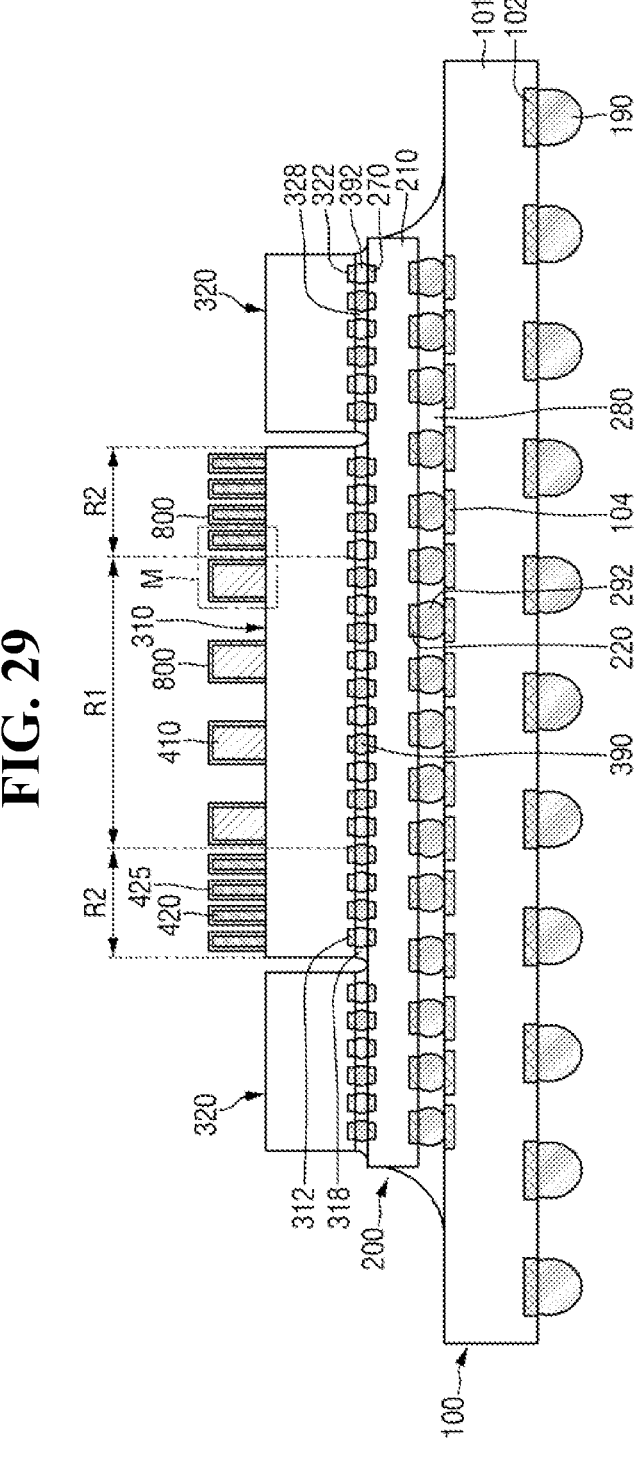
FIG. 29 is a cross-sectional view taken along line A-A of FIG. 28 according to one or more embodiments of the present disclosure.
Figure 30:
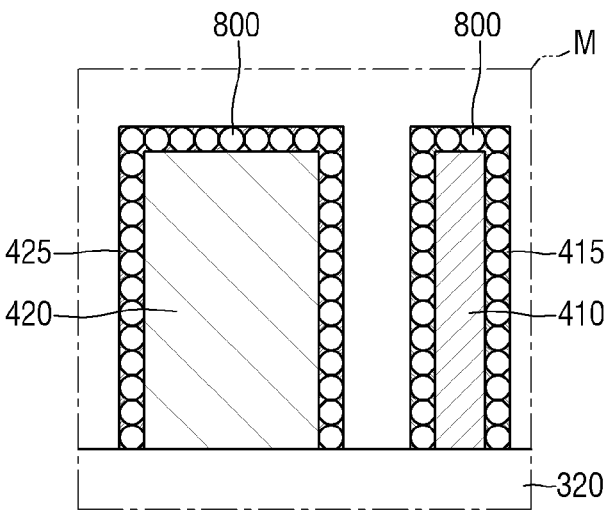
FIG. 30 is an enlarged cross-sectional view of an area M of FIG. 29 according to one or more embodiments of the present disclosure.

FIG. 28 is a layout view of a semiconductor package according to one or more embodiments of the present disclosure. FIG. 29 is a cross-sectional view taken along line A-A of FIG. 28. FIG. 30 is an enlarged cross-sectional view of an area M of FIG. 29. For convenience, the embodiment of FIGS. 28 through 30 will hereinafter be described, focusing mainly on the differences with the embodiment of FIGS. 1 and 2, and repeated descriptions may be omitted.

Referring to FIGS. 28 through 30, the semiconductor package according to one or more embodiments of the present disclosure may include first pins 410, second pins 420, first sub-films 415, second sub-films 425, and sub-holes 800. The first pins 410 and the second pins 420 may be disposed on a first semiconductor chip 310.

The first sub-films 415 may be disposed on the surfaces of the first pins 410. The first sub-films 415 may extend along the profiles of the surfaces of the first pins 410. The second sub-films 425 may be disposed on the surfaces of the second pins 420. The second sub-films 425 may extend along the profiles of the surfaces of the second pins 420. The first sub-films 415 and the second sub-films 425 may include the same or substantially the same materials as the first pins 410 and the second pins 420.

The sub-holes 800 may be disposed on the surfaces of the first pins 410 and the surfaces of the second pins 420. The sub-holes 800 may be disposed in the first sub-films 415 and the second sub-films 425. A plurality of sub-holes 800 may be disposed in each of the first sub-films 415 or in each of the second sub-films 425. The sub-holes 800 may be connected to one another in each of the first sub-films 415 or in each of the second sub-films 425. The sub-holes 800 may be connected to one another on the surface of each of the first pins 410 or the surface of each of the second pins 420.

The distance between the first pins 410, which have the sub-holes 800 formed on the surfaces thereof, may be greater than the distance between the second pins 420, which have the sub-holes 800 formed on the surfaces thereof.

Figure 31:
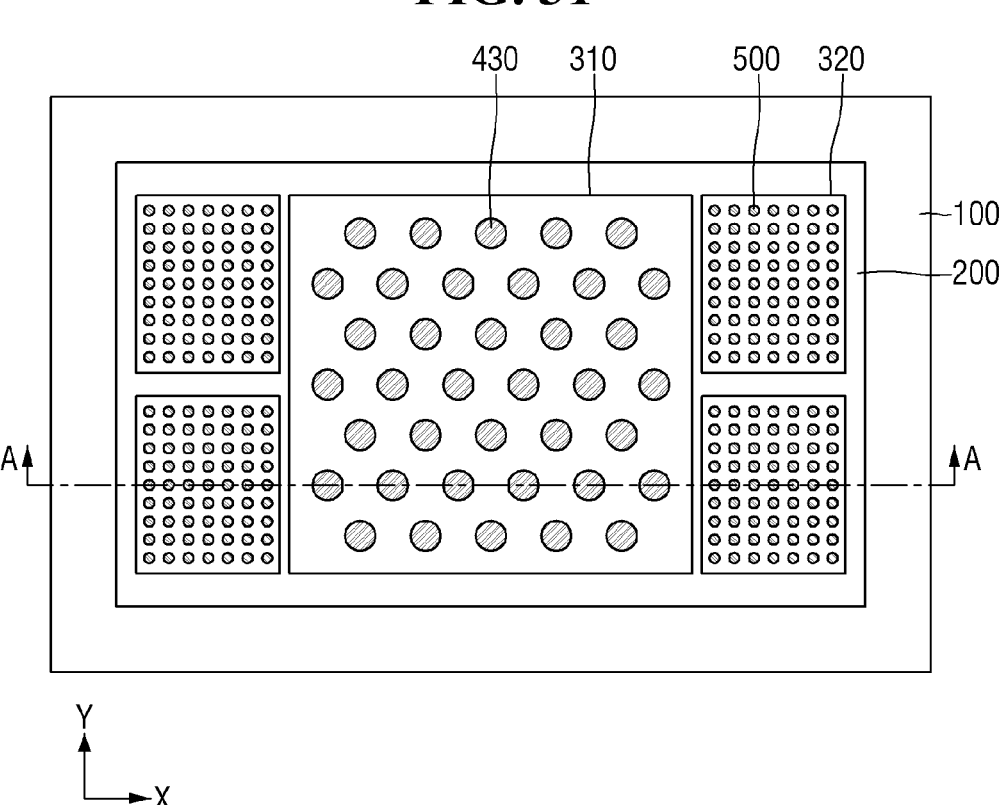
FIG. 31 is a layout view of a semiconductor package according to one or more embodiments of the present disclosure.
Figure 32:
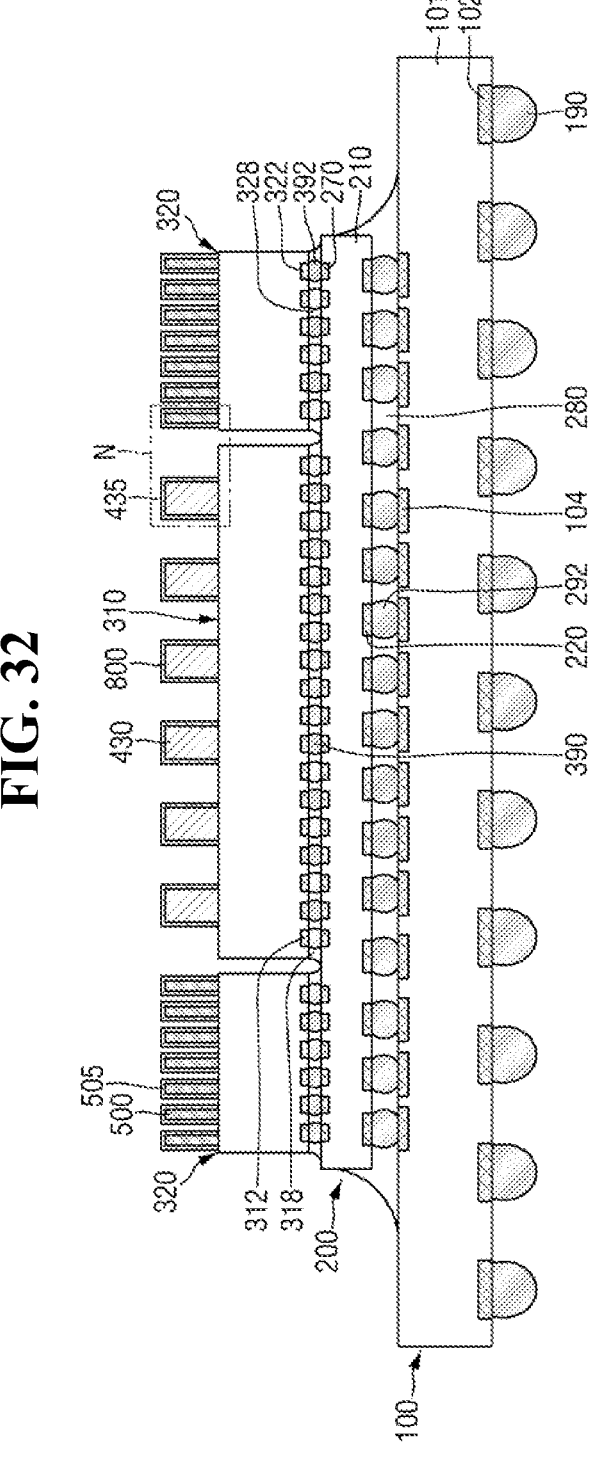
FIG. 32 is a cross-sectional view taken along line A-A of FIG. 31 according to one or more embodiments of the present disclosure.
Figure 33:
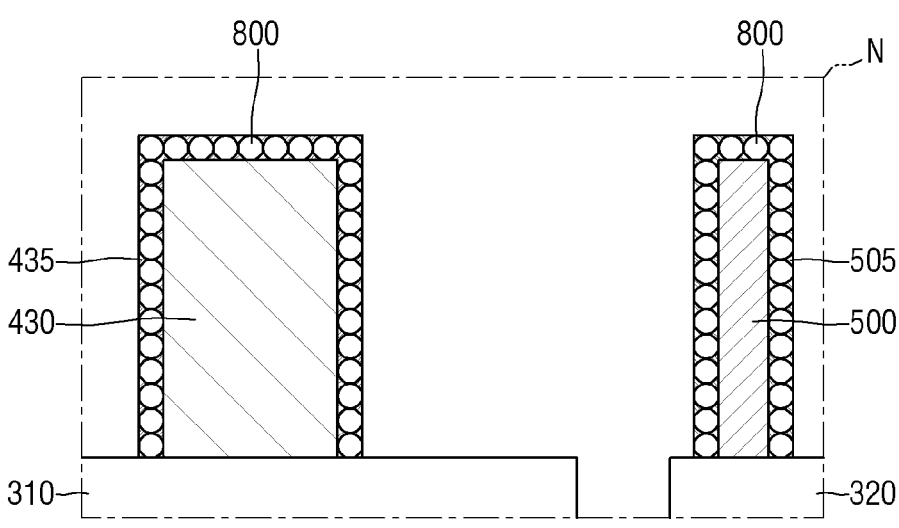
FIG. 33 is an enlarged cross-sectional view of an area N of FIG. 32 according to one or more embodiments of the present disclosure.

FIG. 31 is a layout view of a semiconductor package according to one or more embodiments of the present disclosure. FIG. 32 is a cross-sectional view taken along line A-A of FIG. 31. FIG. 33 is an enlarged cross-sectional view of an area N of FIG. 32. For convenience, the embodiment of FIGS. 31 through 33 will hereinafter be described, focusing mainly on the differences with the embodiment of FIGS. 8, 9, 28, 29, and 30, and repeated descriptions may be omitted.

Referring to FIGS. 31 through 33, the semiconductor package according to one or more embodiments of the present disclosure may include third pins 430, fourth pins 500, third sub-films 435, fourth sub-films 505, and sub-holes 800.

The third pins 430 may be disposed on a first semiconductor chip 310. The fourth pins 500 may be disposed on second semiconductor chips 320.

The third sub-films 435 may be disposed on the surfaces of the third pins 430. The third sub-films 435 may extend along the profiles of the surfaces of the third pins 430. The fourth sub-films 505 may be disposed on the surfaces of the fourth pins 500. The fourth sub-films 505 may extend along the profiles of the surfaces of the fourth pins 500. The third sub-films 435 and the fourth sub-films 505 may include the same or substantially the same materials as the third pins 430 and the fourth pins 500.

The sub-holes 800 may be disposed on the surfaces of the third pins 430 and the surfaces of the fourth pins 500. The sub-holes 800 may be disposed in the third sub-films 435 and the fourth sub-films 505. A plurality of sub-holes 800 may be disposed in each of the third sub-films 435 or in each of the fourth sub-films 505. The sub-holes 800 may be connected to one another in each of the third sub-films 435 or in each of the fourth sub-films 505. The sub-holes 800 may be connected on the surfaces of the third pins 430 or on the surfaces of the fourth pins 500.

The distance between the third pins 430, which have the sub-holes 800 formed on the surfaces thereof, may be greater than the distance between the fourth pins 500, which have the sub-holes 800 formed on the surfaces thereof.

Figure 34:
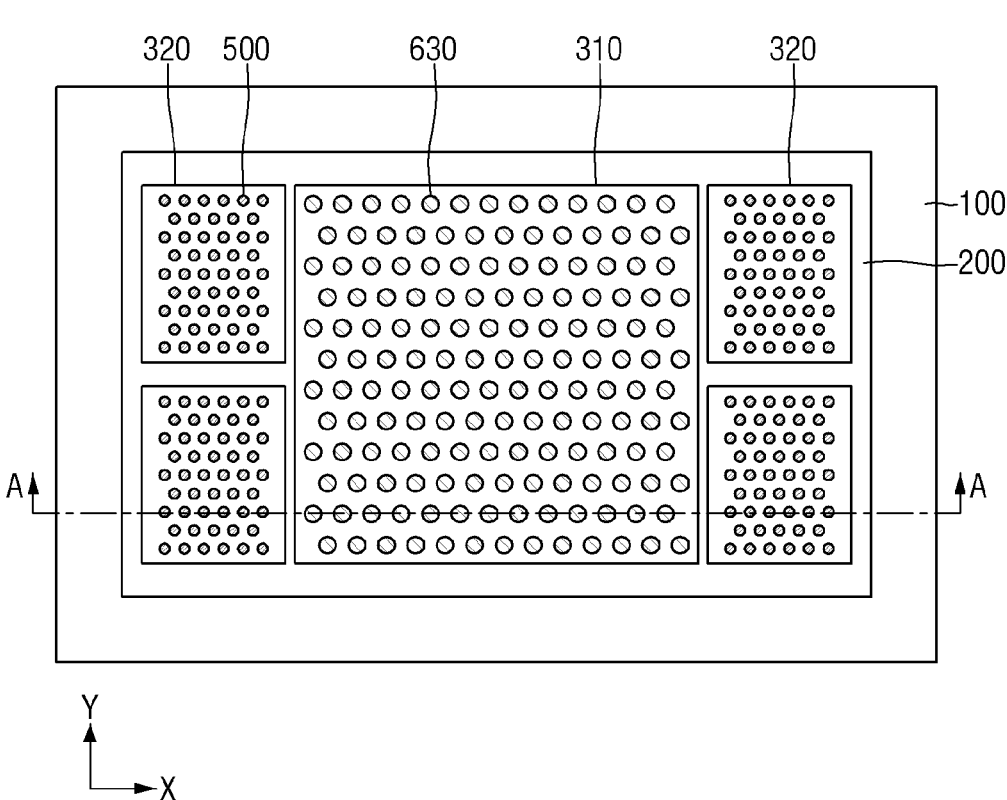
FIG. 34 is a layout view of a semiconductor package according to one or more embodiments of the present disclosure.
Figure 35:
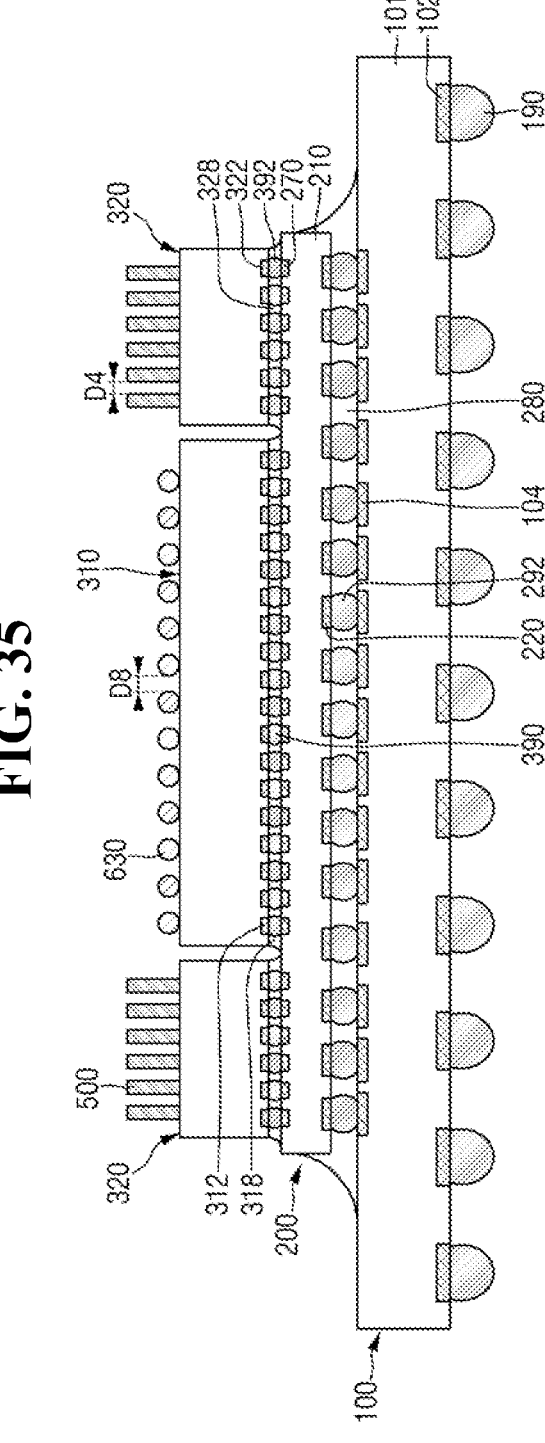
FIG. 35 is a cross-sectional view taken along line A-A of FIG. 34 according to one or more embodiments of the present disclosure.

FIG. 34 is a layout view of a semiconductor package according to one or more embodiments of the present disclosure. FIG. 35 is a cross-sectional view taken along line A-A of FIG. 34. For convenience, the embodiment of FIGS. 34 and 35 will hereinafter be described, focusing mainly on the differences with the embodiment of FIGS. 1 and 2, and repeated descriptions may be omitted.

Referring to FIGS. 34 and 35, the semiconductor package according to one or more embodiments of the present disclosure may include third spheres 630 and fourth pins 500.

The third spheres 630 may be disposed on a first semiconductor chip 310. The fourth pins 500 may be disposed on second semiconductor chips 320.

The third spheres 630 may be spaced apart from one another by an eighth distance D8. The fourth pins 500 may be spaced apart from one another by a fourth distance D4. The eighth distance D8 may be greater than the fourth distance D4.

Figure 36:
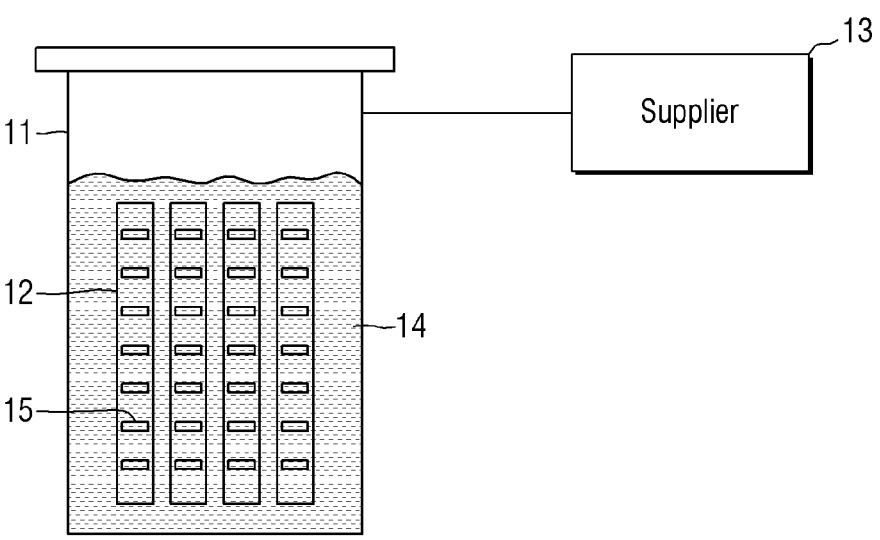
FIG. 36 is a schematic view illustrating a datacenter using semiconductor packages according to one or more embodiments of the present disclosure.
Figure 37:
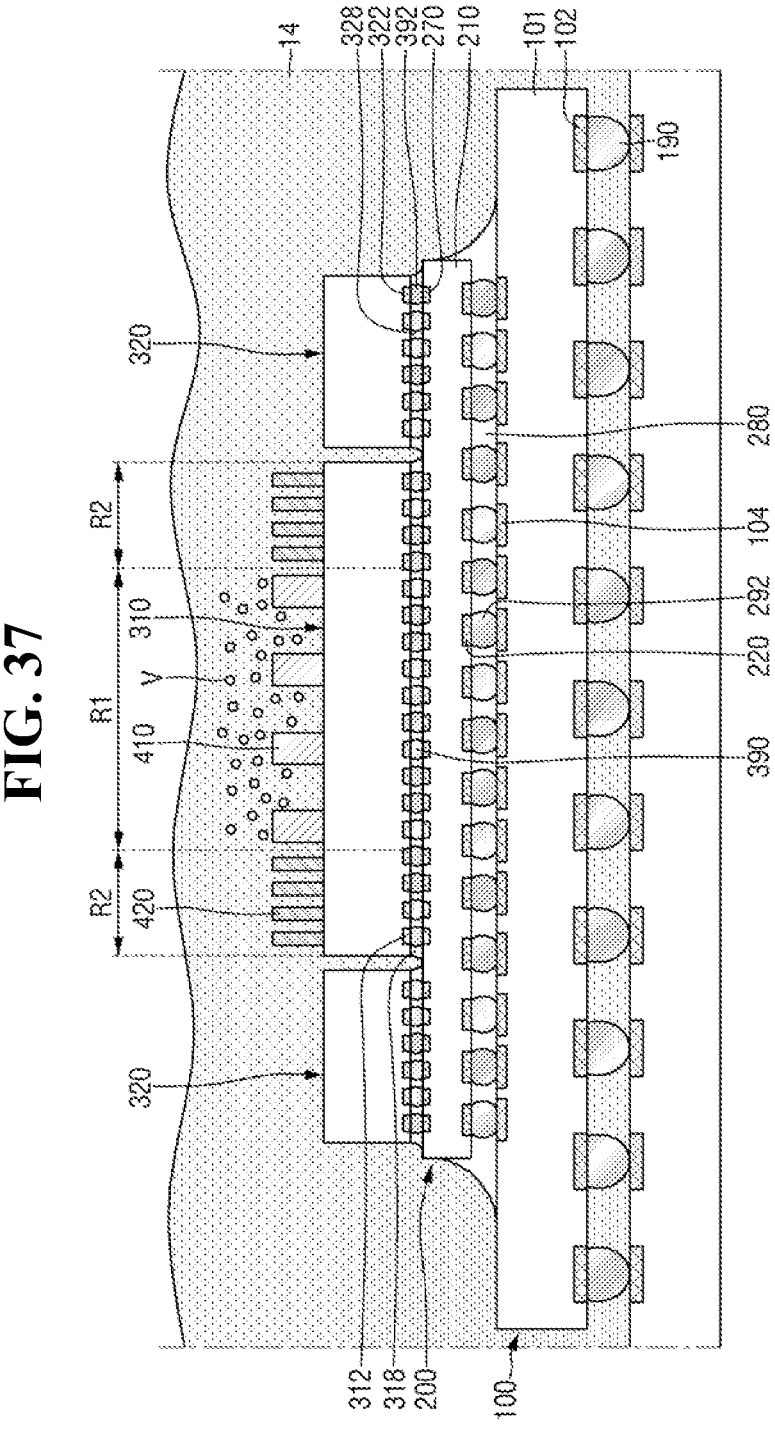
FIG. 37 is a cross-sectional view of a semiconductor package according to one or more embodiments of the present disclosure.

FIG. 36 is a schematic view illustrating a datacenter using semiconductor packages according to one or more embodiments of the present disclosure. FIG. 37 is a cross-sectional view of a semiconductor package according to one or more embodiments of the present disclosure.

Referring to FIG. 36, a datacenter 10 may include a cooling system 11 and a supplier 13.

The cooling system 11 may include racks 12. The racks 12 may store a plurality of semiconductor packages 15 therein. That is, the semiconductor packages 15 may be accommodated in the racks 12.

The cooling system 11 may cool the semiconductor packages 15 using a cooling fluid 14. The racks 12 where the semiconductor packages 15 are mounted may be immersed in the cooling fluid 14. The supplier 13 may provide the cooling fluid 14 to the cooling system 11.

Referring to FIG. 37, the cooling fluid 14 may boil on the top surface of a first semiconductor chip 310. Specifically, the surface roughness of the first semiconductor chip 310 may be greater in the presence of first pins 410 and second pins 420 on the first semiconductor chip 310 than in the absence of the first pins 410 and the second pins 420. As the surface roughness of the first semiconductor chip 310 increases, the cooling fluid 14 may easily boil on the top surface of the first semiconductor chip 310.

As the cooling fluid 14 boils in a first region R1 of the top surface of the first semiconductor chip 310 with the first pins 410 disposed thereon, vapor V may be generated. The cooling fluid 14 may be supplied from a second region R2 where the second pins 420 are disposed to the first region R1. The cooling fluid 14 may flow faster in the second region R2 where the second pins 420 are spaced apart from one another by a smaller distance than the first pins 410 in the first region R1, than in the first region R1. Thus, the cooling fluid 14 can be supplied from the second region R2 to the first region R1.

The first region R1 of the first semiconductor chip 310 may be part of the first semiconductor chip 310 to which a high voltage is provided. The second region R2 of the first semiconductor chip 310 may be part of the first semiconductor chip 310 to which a low voltage is provided. Thus, the temperature may be higher in the first region R1 than in the second region R2.

As the cooling fluid 14 boils easily and fast on the top surface of the first semiconductor chip 310 where the first pins 410 and the second pins 420 are disposed, the efficiency of cooling the semiconductor package according to one or more embodiments of the present disclosure can be improved.

Figure 38:
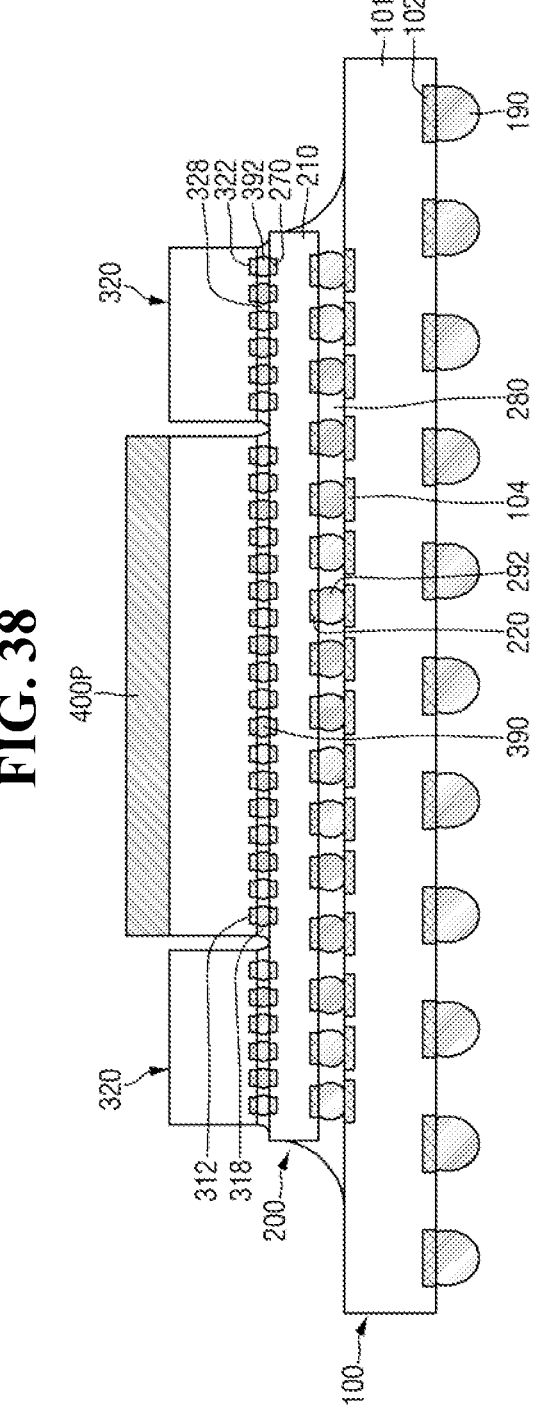
FIGS. 38, 39 and 40 are cross-sectional views illustrating a method of fabricating a semiconductor package according to one or more embodiments of the present disclosure.
Figure 39:
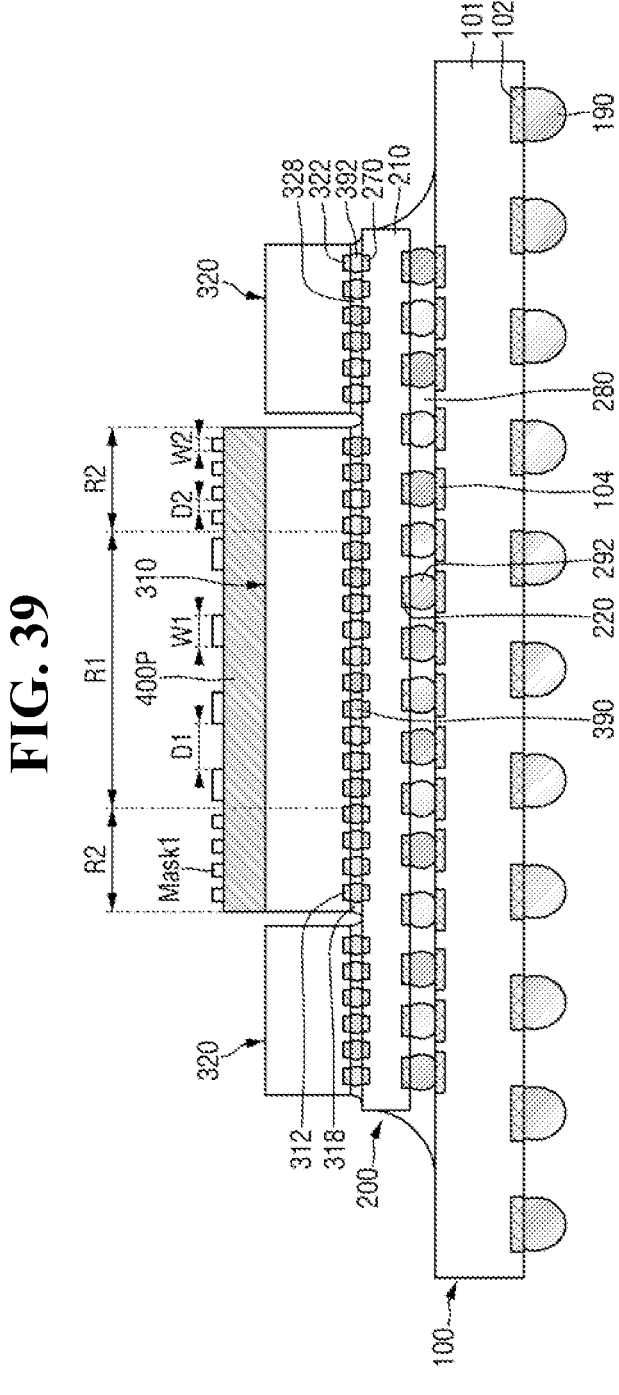
Figure 40:
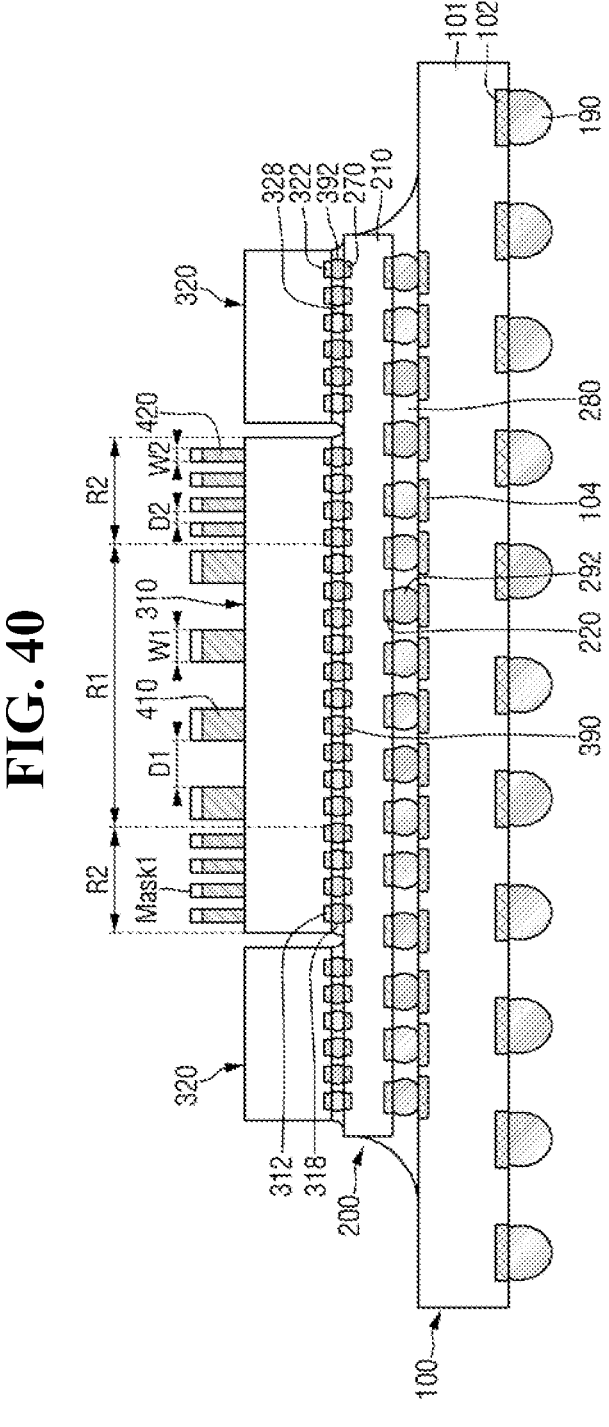

FIGS. 38 through 40 are cross-sectional views illustrating a method of fabricating a semiconductor package according to one or more embodiments of the present disclosure. Specifically, FIGS. 38 through 40 illustrate intermediate steps of a method of fabricating the semiconductor package of FIG. 2.

Referring to FIGS. 2 and 38, a pre-protrusion layer 400P may be formed on a first semiconductor chip 310.

The pre-protrusion layer 400P may cover the entire top surface of the first semiconductor chip 310. Alternatively, the pre-protrusion layer 400P may at least partially cover the top surface of the first semiconductor chip 310. The pre-protrusion layer 400P may include a metal material. For example, the pre-protrusion layer 400P may include Cu.

Referring to FIG. 39, a first mask Mask1 may be formed on the pre-protrusion layer 400P.

The distance between parts of the first mask Mask1 may differ from a first region R1 to a second region R2. Specifically, the parts of the first mask Mask1 may be spaced apart from one another by a first distance D1 in the first region R1 and by a second distance D2 in the second region R2. The parts of the first mask Mask1 may have a first width W1 in the first region R1 and a second width W2 in the second region R2.

Referring to FIG. 40, first pins 410 and second pins 420 may be formed by patterning the pre-protrusion layer 400P.

Parts of the pre-protrusion layer 400P that are not covered by the first mask Mask1 may be removed. For example, the parts of the pre-protrusion layer 400P that are not covered by the first mask Mask1 may be etched away.

Thereafter, referring to FIG. 2, the first mask Mask1 may be removed.

FIGS. 41 through 44 are cross-sectional views illustrating a method of fabricating a semiconductor package according to one or more embodiments of the present disclosure. Specifically, FIGS. 41 through 44 illustrate intermediate steps of a method of fabricating the semiconductor package of FIG. 2.

Figure 41:
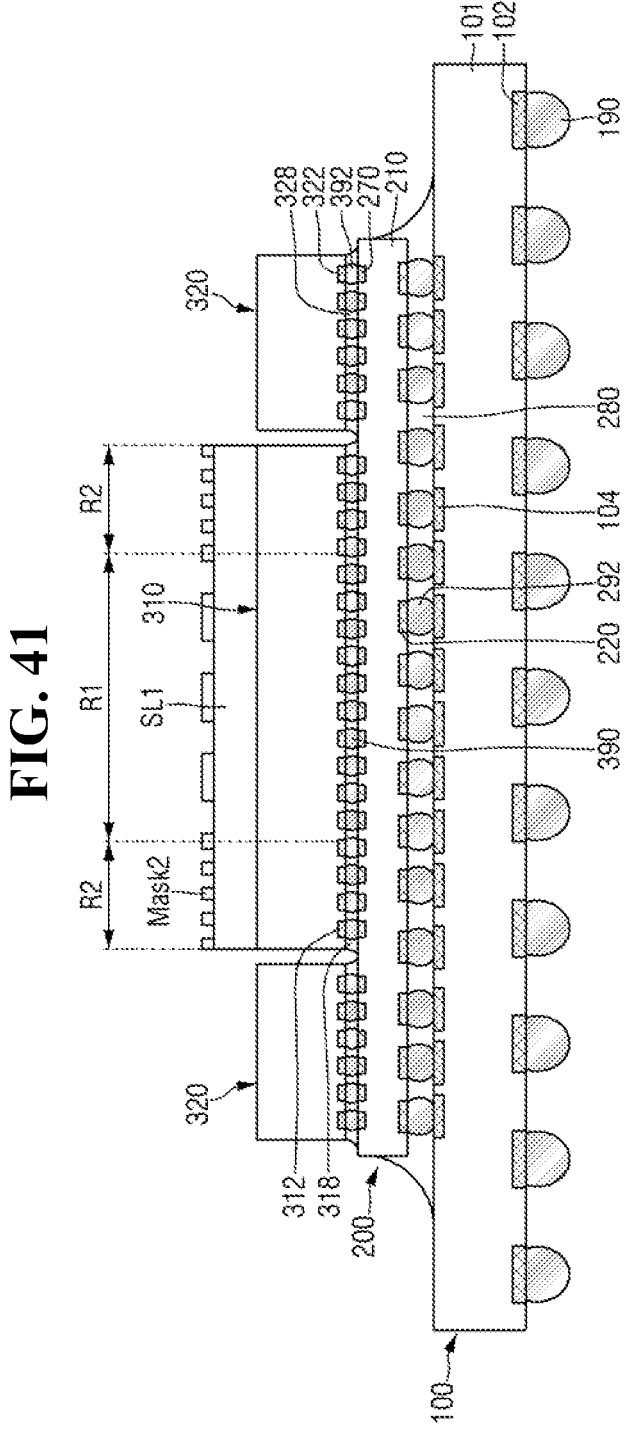
FIGS. 41, 42, 43 and 44 are cross-sectional views illustrating a method of fabricating a semiconductor package according to one or more embodiments of the present disclosure.

Referring to FIG. 41, a first sacrificial layer SL1 and a second mask Mask2 may be formed on a first semiconductor chip 310.

The first sacrificial layer SL1 may cover the entire or a portion of the top surface of the first semiconductor chip 310. The first sacrificial layer SL1 may include an insulating material. For example, the first sacrificial layer SL1 may include silicon oxide or silicon nitride.

The second mask Mask2 may cover or at least partially cover parts of the first sacrificial layer SL1. The second mask Mask2 may not overlap the first mask Mask1 of FIG. 39.

The distance between parts of the second mask Mask2 may differ from the first region R1 to the second region R2.

Figure 42:
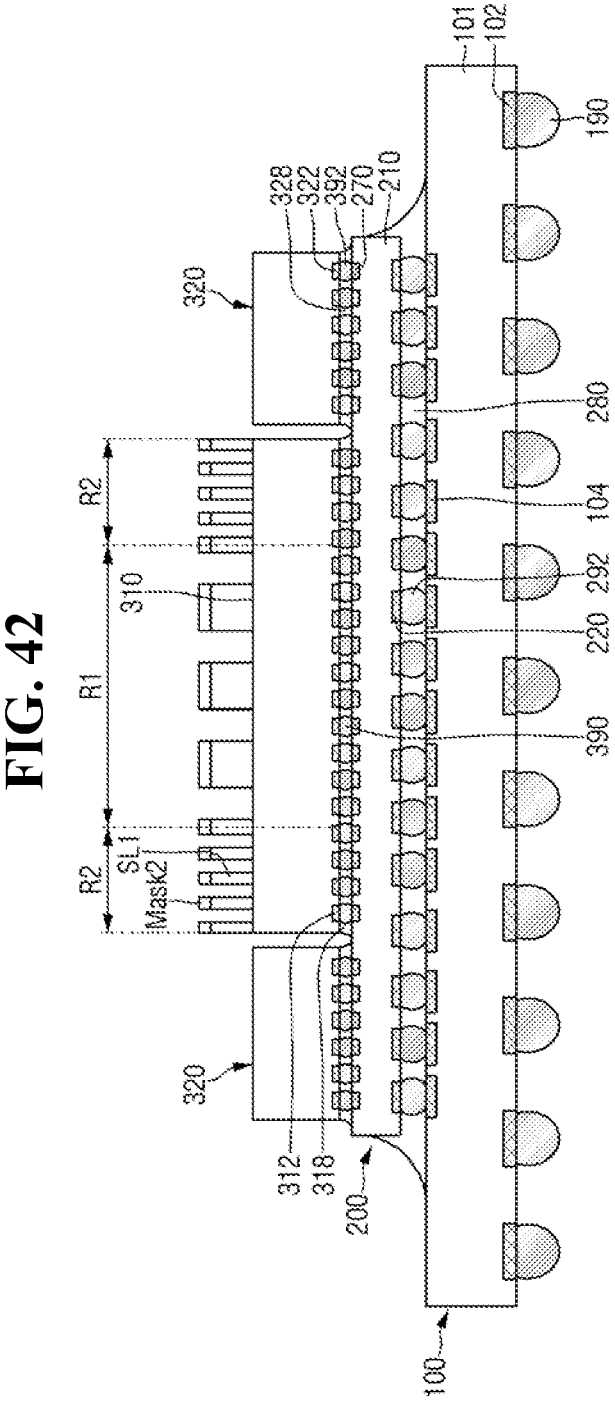

Referring to FIG. 42, the first sacrificial layer SL1 may be patterned.

Parts of the first sacrificial layer SL1 that are not covered by the second mask Mask2 may be removed. For example, the parts of the first sacrificial layer SL1 that are not covered by the second mask Mask2 may be etched away.

Figure 43:
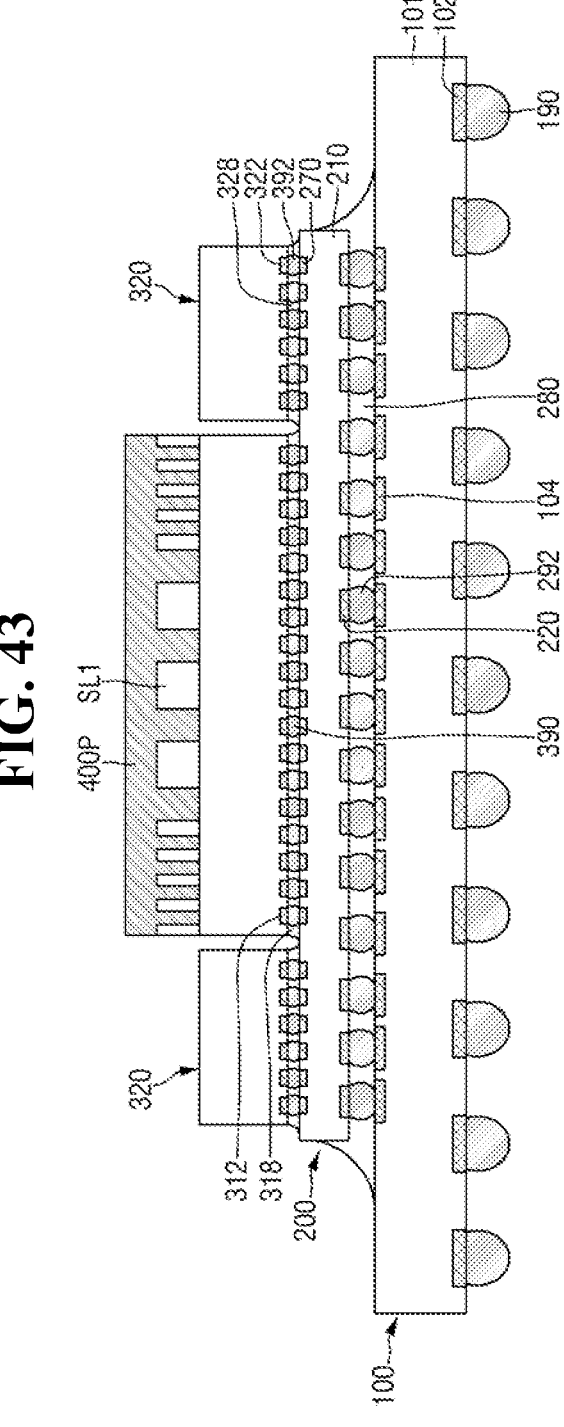

Referring to FIG. 43, the second mask Mask2 may be removed, and a pre-protrusion layer 400P is formed.

The pre-protrusion layer 400P may fill or at least partially fill the gaps between patterned parts of the first sacrificial layer SL1. The pre-protrusion layer 400P may cover or at least partially cover the first sacrificial layer SL1.

Figure 44:
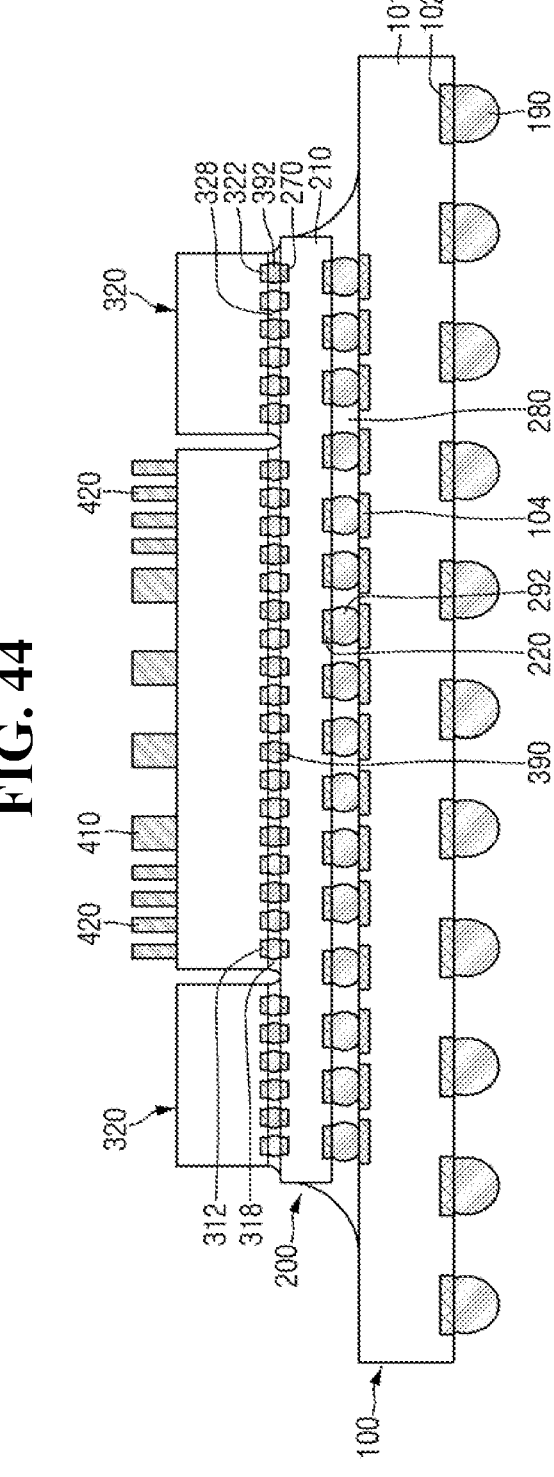

Referring to FIG. 44, the first sacrificial layer SL1 may be removed, and first pins 410 and second pins 420 may be formed.

Specifically, referring to FIGS. 43 and 44, part of the pre-protrusion layer 400P covering the top surface of the first sacrificial layer SL1 may be ground. Thereafter, the first sacrificial layer SL1 may be removed.

FIGS. 45 through 48 are cross-sectional views illustrating a method of fabricating a semiconductor package according to one or more embodiments of the present disclosure. Specifically, FIGS. 45 through 48 illustrate intermediate steps of a method of fabricating the semiconductor package of FIG. 17.

Figure 45:
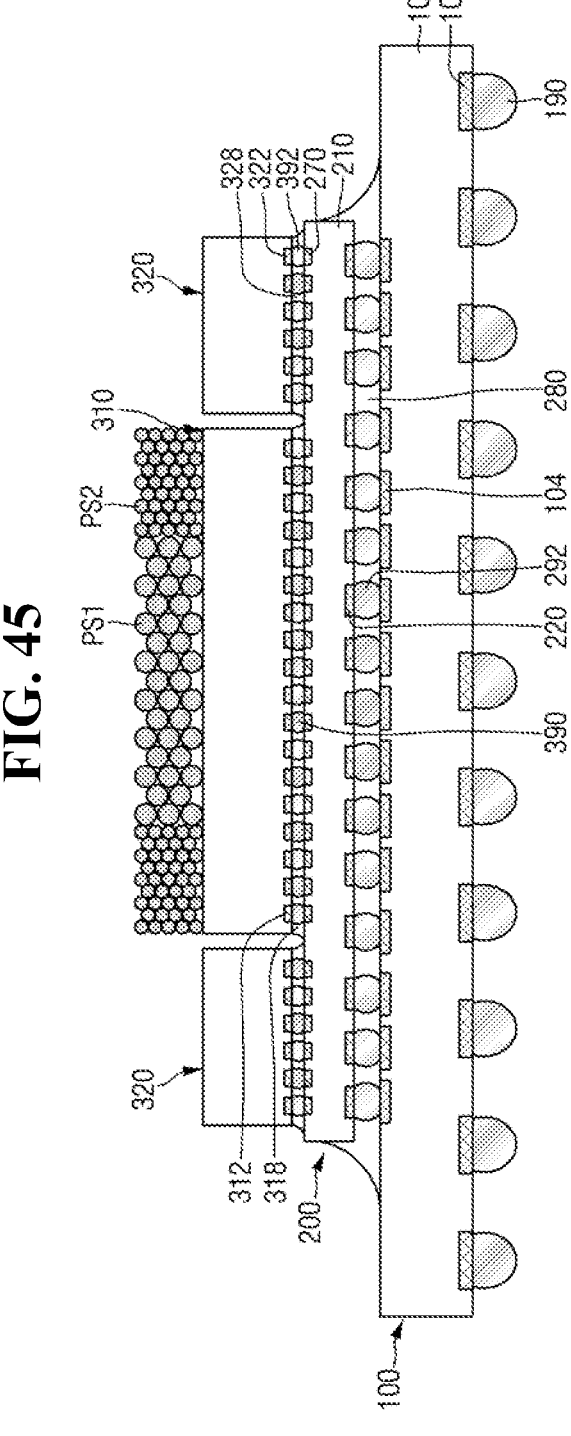
FIGS. 45, 46, 47 and 48 are cross-sectional views illustrating a method of fabricating a semiconductor package according to one or more embodiments of the present disclosure.

Referring to FIG. 45, first sacrificial spheres PS1 and second sacrificial spheres PS2 may be formed.

The first sacrificial spheres PS1 and the second sacrificial spheres PS2 may be formed on a first semiconductor chip 310. The first sacrificial spheres PS1 and the second sacrificial spheres PS2 may be formed on the top surface of the first semiconductor chip 310. The first sacrificial spheres PS1 and the second sacrificial spheres PS2 may have different sizes. The first sacrificial spheres PS1 and the second sacrificial spheres PS2 may have different diameters.

The first sacrificial spheres PS1 and the second sacrificial spheres PS2 may form multilayers. The spaces between the first sacrificial spheres PS1 in the multilayers formed by the first sacrificial spheres PS1 may be larger than the spaces between the second sacrificial spheres PS2 in the multilayers formed by the second sacrificial spheres PS2.

The first sacrificial spheres PS1 and the second sacrificial spheres PS2 may include, for example, a plastic material.

Figure 46:
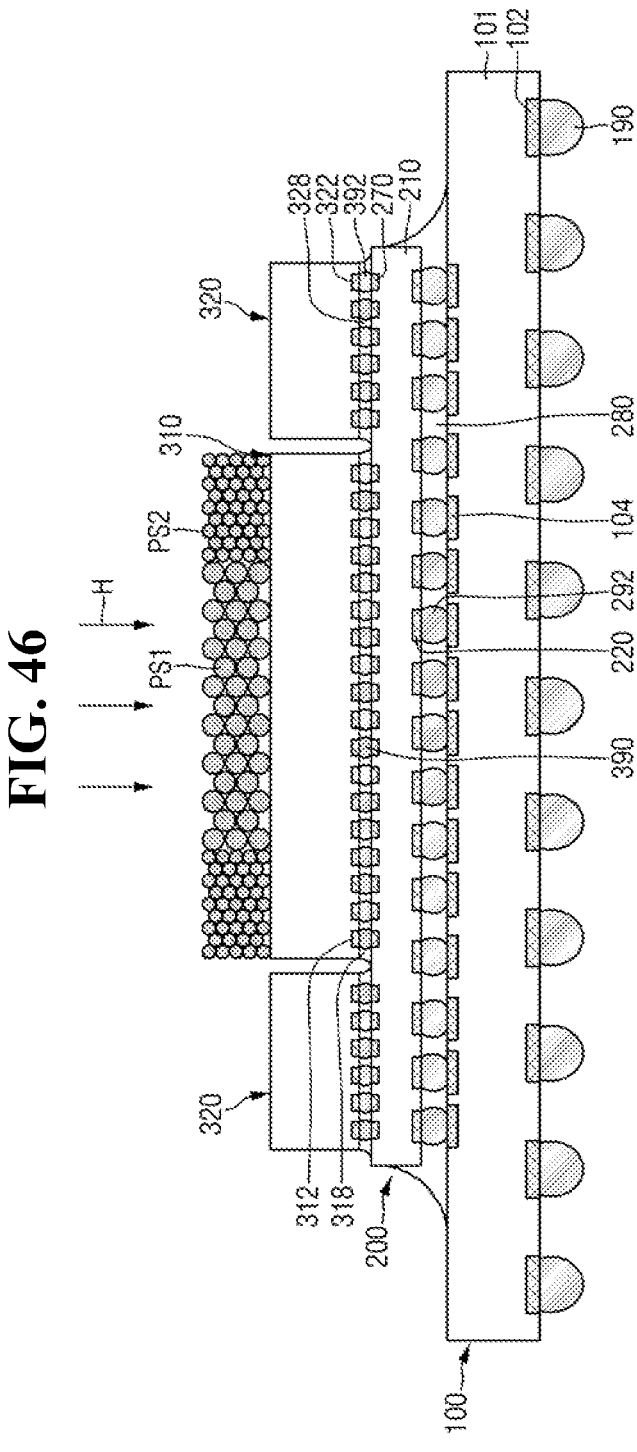

Referring to FIG. 46, the first sacrificial spheres PS1 and the second sacrificial spheres PS2 may be thermally treated.

Heat H may be provided onto the first semiconductor chip 310 where the first sacrificial spheres PS1 and the second sacrificial spheres PS2 are disposed. The first sacrificial spheres PS1 and the second sacrificial spheres PS2 may be heated.

Figure 47:
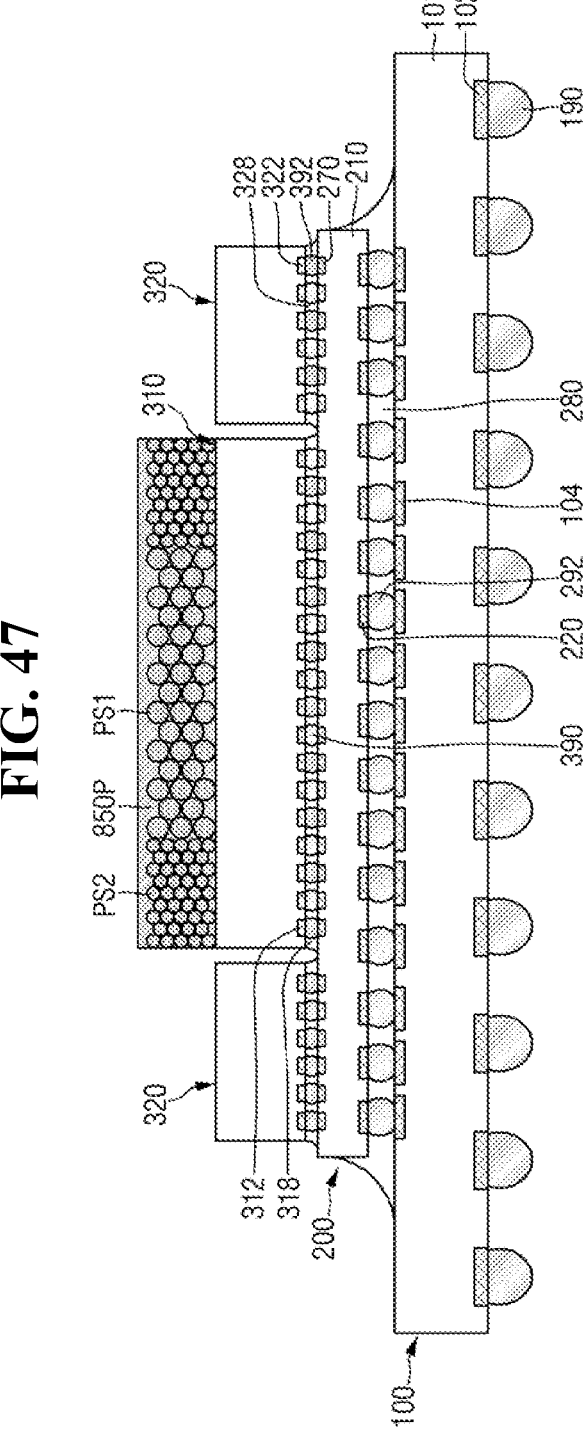

Referring to FIG. 47, a first pre-mold film 850P may be formed.

The first pre-mold film 850P may be formed on the first semiconductor chip 310. The first pre-mold film 850P may fill or at least partially fill the spaces between the first sacrificial spheres PS1, between the second sacrificial spheres PS2, and between the first sacrificial spheres PS1 and the second sacrificial spheres PS2. The first pre-mold film 850P may cover or at least partially cover the first sacrificial spheres PS1 and the second sacrificial spheres PS2. The first pre-mold film 850P may include at least one of Si, a Si compound, and a metal material.

Figure 48:
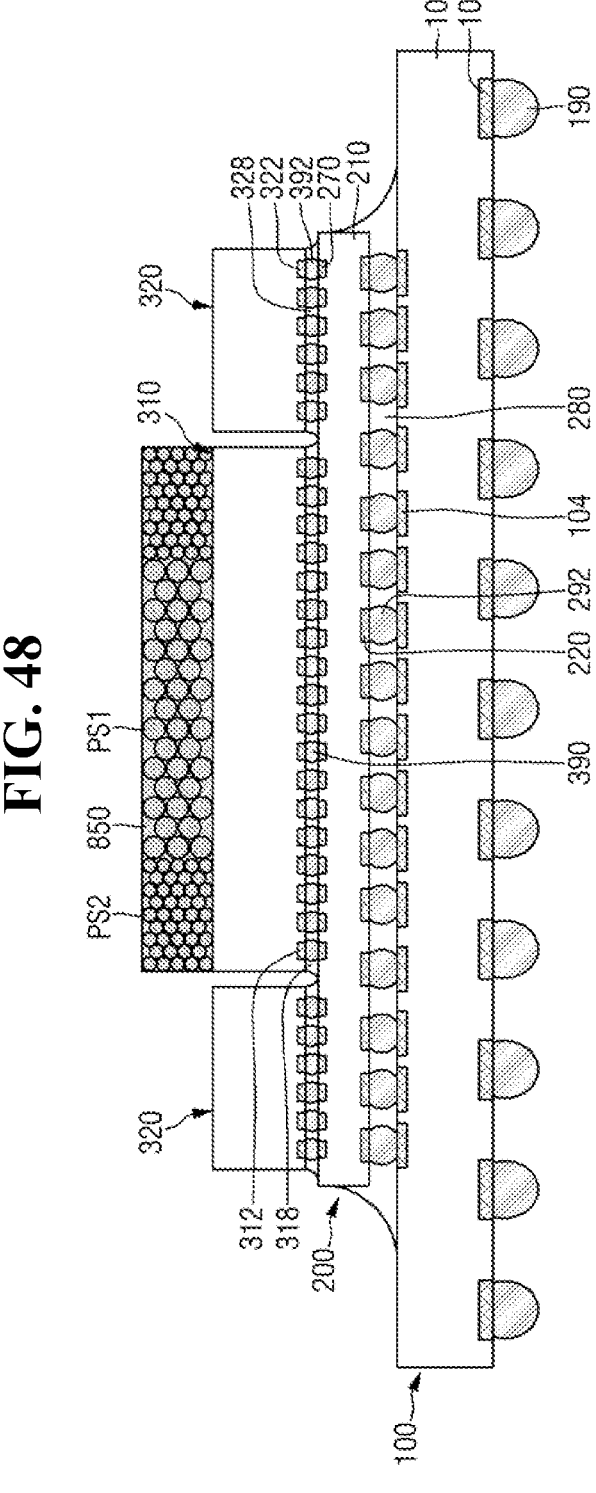

Referring to FIG. 48, a first mold film 850 may be formed.

The first mold film 850 may be formed by grinding the first pre-mold film 850P. The first mold film 850 may expose the first sacrificial spheres PS1 and the second sacrificial spheres PS2.

Thereafter, the first sacrificial spheres PS1 and the second sacrificial spheres PS2 may be removed, and first holes 810 and second holes 820 may be formed (e.g., FIG. 17).

The first sacrificial spheres PS1 and the second sacrificial spheres PS2 that are thermally treated may be removed. As the first sacrificial spheres PS1 and the second sacrificial spheres PS2 are removed, the first holes 810 and the second holes 820 may be formed. The first holes 810 may be formed in the spaces where the first sacrificial spheres PS1 previously reside. The second holes 820 may be formed in the spaces where the second sacrificial spheres PS2 previously reside.

The first sacrificial spheres PS1 and the second sacrificial spheres PS2 may be removed using, for example, a tetrahydrofuran, $(CH_2)_4O)$ solution.

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. A semiconductor package comprising:
 a package substrate;
 an interposer on the package substrate and comprising first upper pads, the first upper pads comprising a first set of upper pads and a second set of upper pads;
 a first semiconductor chip on the interposer and comprising first lower pads respectively connected to the first set of upper pads;
 a plurality of first pins on a first top surface of the first semiconductor chip and substantially uniformly spaced apart by a first distance; and
 a plurality of second pins on the first top surface of the first semiconductor chip and substantially uniformly spaced apart by a second distance that is different from the first distance,
 wherein the first top surface of the first semiconductor chip comprises a first region and a second region that does not overlap the first region, wherein the plurality of first pins are in the first region, and wherein the plurality of second pins are in the second region.

2. The semiconductor package of claim 1, wherein the plurality of first pins and the plurality of second pins comprise a metal material.

3. The semiconductor package of claim 1, wherein each of the plurality of first pins have a first width, and wherein each of the plurality of second pins have a second width that is less than the first width.

4. The semiconductor package of claim 1, wherein the first top surface of the first semiconductor chip comprises an area between the plurality of first pins that is exposed, an area between the plurality of second pins that is exposed, and an area between the plurality of first pins and the plurality of second pins that is exposed.

5. The semiconductor package of claim 1, further comprising:

a second semiconductor chip on the interposer, and spaced apart from the first semiconductor chip, the second semiconductor chip comprising second lower pads respectively connected to the second set of upper pads.

6. The semiconductor package of claim 5, wherein, with respect to a top surface of the package substrate, the first top surface of the first semiconductor chip is below a second top surface of the second semiconductor chip.

7. The semiconductor package of claim 5, further comprising:

a plurality of third pins on a second top surface of the second semiconductor chip, the plurality of third pins being substantially uniformly spaced apart by a third distance.

8. The semiconductor package of claim 7, wherein the first distance is greater than the third distance.

9. The semiconductor package of claim 7, wherein a first height of the plurality of first pins from the first top surface of the first semiconductor chip, a second height of the plurality of second pins from the first top surface of the first semiconductor chip, and a third height of the plurality of third pins from the first top surface of the first semiconductor chip are substantially the same.

10. The semiconductor package of claim 5, wherein the first semiconductor chip comprises a logic semiconductor chip, and wherein the second semiconductor chip comprises at least one memory semiconductor chip.

11. The semiconductor package of claim 5, wherein the first top surface of the first semiconductor chip and a second top surface of the second semiconductor chip are coplanar.

12. The semiconductor package of claim 1, further comprising:

a plurality of spheres on surfaces of the plurality of first pins and on surfaces of the plurality of second pins.

13. The semiconductor package of claim 1, wherein the second region surrounds the first region in a plan view.

14. A semiconductor package comprising:

a package substrate;

an interposer on the package substrate and comprising first upper pads, the first upper pads comprising a first set of upper pads and a second set of upper pads;

a first semiconductor chip on the interposer and comprising first lower pads respectively connected to the first set of upper pads;

a second semiconductor chip on the interposer and spaced apart from the first semiconductor chip, the second semiconductor chip comprising second lower pads respectively connected to the second set of upper pads;

a plurality of first protruding structures in a first region of a first top surface of the first semiconductor chip, the plurality of first protruding structures being spaced apart by a first distance; and a plurality of second protruding structures spaced apart by a second distance that is less than the first distance, the plurality of second protruding structures being spaced apart from the plurality of first protruding structures, wherein the first top surface of the first semiconductor chip comprises a second region that does not overlap the first region, wherein a second top surface of the second semiconductor chip comprises a third region, and wherein the plurality of second protruding structures are in at least one of the second region and the third region.

15. The semiconductor package of claim 14, wherein the first top surface and the second top surface comprise silicon, and wherein the plurality of first protruding structures and the plurality of second protruding structures comprise at least one of silicon, a silicon compound, and a metal material.

16. The semiconductor package of claim 14, wherein the first semiconductor chip comprises a logic semiconductor chip, and wherein the second semiconductor chip comprises at least one stack of a plurality of memory semiconductor chips.

17. The semiconductor package of claim 14, wherein the plurality of first protruding structures comprises a plurality of first spheres having a first diameter, and wherein the plurality of second protruding structures comprises a plurality of second spheres having a second diameter that is less than the first diameter.

18. The semiconductor package of claim 14, wherein the plurality of first protruding structures comprises a plurality of first pins having a cylindrical shape, and wherein the plurality of second protruding structures comprises a plurality of second pins having a cylindrical shape.

19. The semiconductor package of claim 18, further comprising:

a plurality of spheres on surfaces of the plurality of first pins and on surfaces of the plurality of second pins.

20. A semiconductor package comprising:

a package substrate comprising upper substrate pads exposed at a top surface of the package substrate;

an interposer on the package substrate and comprising first upper pads, the first upper pads comprising a first set of upper pads and a second set of upper pads;

a first semiconductor chip on the interposer, the first semiconductor chip comprising:

first lower bumps; and first lower pads respectively connected to the first set of upper pads;

a second semiconductor chip on the interposer and spaced apart from the first semiconductor chip, the second semiconductor chip comprising:

second lower bumps; and second lower pads respectively connected to the second set of upper pads;

a plurality of first pins in a first region of a first top surface of the first semiconductor chip, the plurality of first pins being spaced apart by a first distance; and a plurality of second pins spaced apart by a second distance that is less than the first distance, wherein the interposer further comprises:

third lower bumps; and third lower pads respectively connected to the upper substrate pads, wherein the first lower bumps are between the first set of upper pads and the first lower pads, wherein the second lower bumps are between the second set of upper pads and the second lower pads, wherein the plurality of first pins and the plurality of second pins comprise a metal material, wherein the first top surface of the first semiconductor chip comprises a second region that does not overlap the first region, wherein a second top surface of the second semiconductor chip comprises a third region, wherein the plurality of second pins are in at least one of the second region and the third region, wherein the first semiconductor chip comprises a logic semiconductor chip, and wherein the second semiconductor chip comprises at least one memory semiconductor chip.

* * * * *